US011038085B2

(12) United States Patent
Chen et al.

(10) Patent No.: US 11,038,085 B2
(45) Date of Patent: Jun. 15, 2021

(54) LIGHT-EMITTING DEVICE WITH A PLURALITY OF ELECTRODES ON A SEMICONDUCTOR STACK

(71) Applicant: EPISTAR CORPORATION, Hsinchu (TW)

(72) Inventors: Chao-Hsing Chen, Hsinchu (TW); Cheng-Lin Lu, Hsinchu (TW); Chih-Hao Chen, Hsinchu (TW); Chi-Shiang Hsu, Hsinchu (TW); I-Lun Ma, Hsinchu (TW); Meng-Hsiang Hong, Hsinchu (TW); Hsin-Ying Wang, Hsinchu (TW); Kuo-Ching Hung, Hsinchu (TW); Yi-Hung Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 39 days.

(21) Appl. No.: 16/529,370

(22) Filed: Aug. 1, 2019

(65) Prior Publication Data
US 2020/0044116 A1 Feb. 6, 2020

(30) Foreign Application Priority Data
Aug. 1, 2018 (TW) ................................. 107126770

(51) Int. Cl.
*H01L 33/00* (2010.01)
*H01L 31/0232* (2014.01)
(Continued)

(52) U.S. Cl.
CPC ........ *H01L 33/385* (2013.01); *H01L 33/0075* (2013.01); *H01L 33/10* (2013.01);
(Continued)

(58) Field of Classification Search
CPC ... H01L 33/385; H01L 33/0075; H01L 33/10; H01L 33/24; H01L 33/32; H01L 33/46
See application file for complete search history.

(56) References Cited

U.S. PATENT DOCUMENTS 10,651,344 B2 * 5/2020 Chen ..................... H01L 33/22
10,680,136 B2 * 6/2020 Chen ..................... H01L 33/22
(Continued)

*Primary Examiner* — Alonzo Chambliss
(74) *Attorney, Agent, or Firm* — Ditthavong, Steiner & Mlotkowski

(57) ABSTRACT

A light-emitting device includes a substrate including a top surface, a first side surface and a second side surface, wherein the first side surface and the second side surface of the substrate are respectively connected to two opposite sides of the top surface of the substrate; a semiconductor stack formed on the top surface of the substrate, the semiconductor stack including a first semiconductor layer, a second semiconductor layer, and an active layer formed between the first semiconductor layer and the second semiconductor layer; a first electrode pad formed adjacent to a first edge of the light-emitting device; and a second electrode pad formed adjacent to a second edge of the light-emitting device, wherein in a top view of the light-emitting device, the first edge and the second edge are formed on different sides or opposite sides of the light-emitting device, the first semiconductor layer adjacent to the first edge includes a first sidewall directly connected to the first side surface of the substrate, and the first semiconductor layer adjacent to the second edge includes a second sidewall separated from the second side surface of the substrate by a distance.

20 Claims, 25 Drawing Sheets

(51) Int. Cl.
*H01L 21/00* (2006.01)
*H01L 33/38* (2010.01)
*H01L 33/10* (2010.01)
*H01L 33/32* (2010.01)
*H01L 33/46* (2010.01)
*H01L 33/24* (2010.01)

(52) U.S. Cl.
CPC .............. *H01L 33/24* (2013.01); *H01L 33/32* (2013.01); *H01L 33/46* (2013.01)

(56) References Cited

U.S. PATENT DOCUMENTS

| | | | |
|---|---|---|---|
| 10,749,075 B2* | 8/2020 | Chen | H01L 33/46 |
| 2014/0034981 A1* | 2/2014 | Hung | H01L 33/46 |
| | | | 257/98 |
| 2015/0108525 A1* | 4/2015 | Chae | H01L 33/06 |
| | | | 257/98 |

* cited by examiner

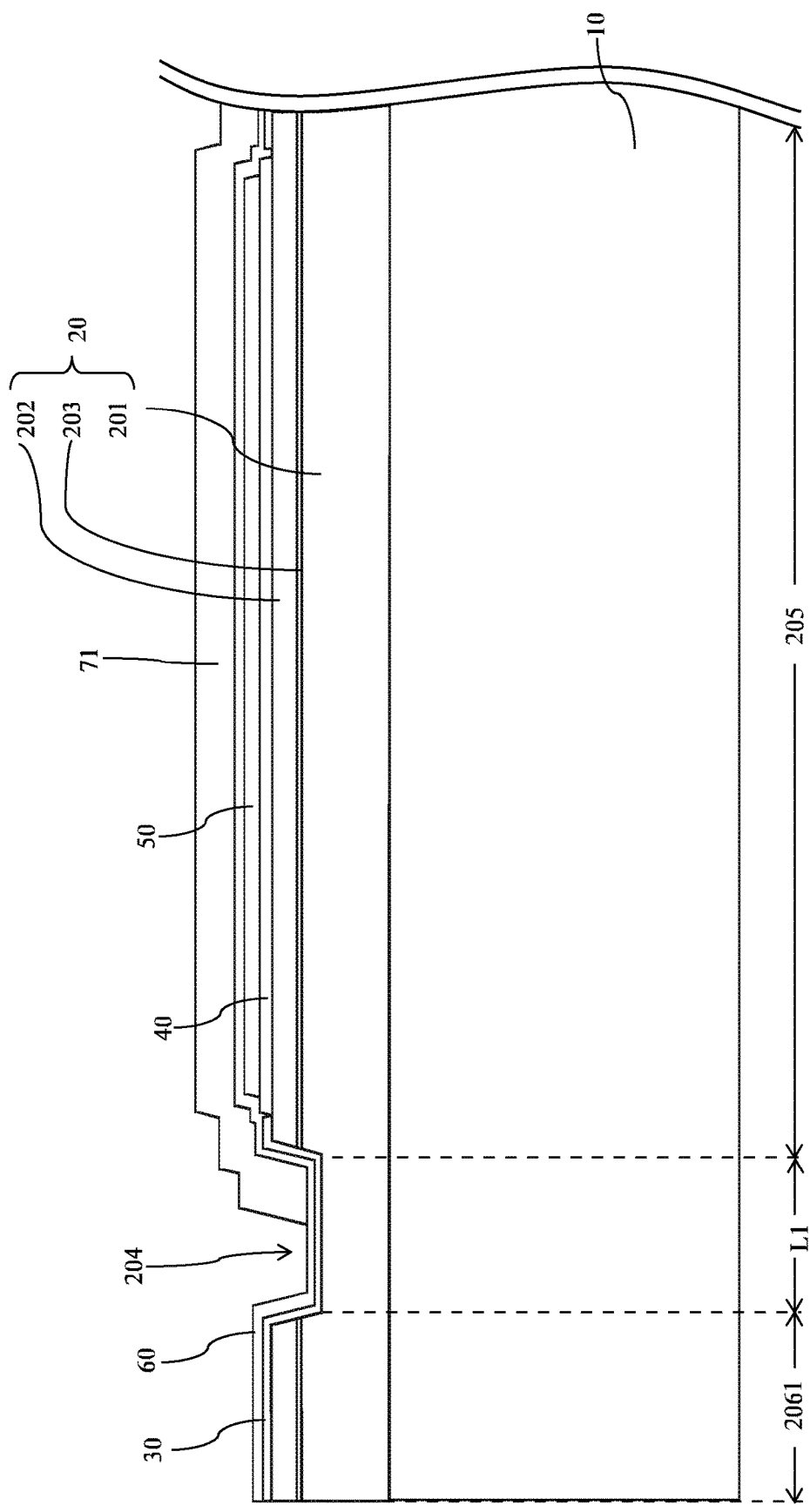

LIGHT-EMITTING DEVICE WITH A PLURALITY OF ELECTRODES ON A SEMICONDUCTOR STACK

TECHNICAL FIELD

The application relates to a light-emitting device, and more particularly, to a flip-chip light-emitting device including a semiconductor stack, a first electrode and a second electrode formed on the same side of the semiconductor stack.

REFERENCE TO RELATED APPLICATION

This application claims the right of priority based on TW Application Serial No. 107126770, filed on Aug. 1, 2018, and the content of which is hereby incorporated by reference in its entirety.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, light-emitting diodes are widely used in household appliances, equipment indicators, and optoelectronic products.

SUMMARY OF THE APPLICATION

An object of the present application is to provide a light-emitting device and a manufacturing method of the light-emitting device to improve the light extraction efficiency of the light-emitting device.

Another object of the present application is to provide a light-emitting device and a manufacturing method of the light-emitting device to improve the light extraction efficiency by a pattern formed on a side surface of the semiconductor stack.

Another object of the present application is to provide a light-emitting device and a manufacturing method of the light-emitting device to improve the production yield by an identification pattern and an identifying method used in a cutting process.

Another object of the present application is to provide a light-emitting device and a manufacturing method of the light-emitting device to improve the reliability of a package apparatus.

In order to achieve at least one of the above objects, in accordance with an embodiment of the present application, a light-emitting device includes a substrate including a top surface, a first side surface and a second side surface, wherein the first side surface and the second side surface of the substrate are respectively connected to two opposite sides of the top surface of the substrate; a semiconductor stack formed on the top surface of the substrate, the semiconductor stack including a first semiconductor layer, a second semiconductor layer, and an active layer formed between the first semiconductor layer and the second semiconductor layer; a first electrode pad formed adjacent to a first edge of the light-emitting device; and a second electrode pad formed adjacent to a second edge of the light-emitting device, wherein in a top view of the light-emitting device, the first edge and the second edge are formed on different sides or opposite sides of the light-emitting device, the first semiconductor layer adjacent to the first edge includes a first sidewall directly connected to the first side surface of the substrate, and the first semiconductor layer adjacent to the second edge includes a second sidewall separated from the second side surface of the substrate by a distance to expose the substrate.

In order to achieve at least one of the above objects, in accordance with an embodiment of the present application, a light-emitting device includes a substrate including a plurality of corners and a plurality of edges; a semiconductor stack formed on the substrate; and a plurality of semiconductor structures respectively formed on the plurality of corners and the plurality of edges of the substrate, wherein the plurality of semiconductor structures is separated from the semiconductor stack by a distance, and the plurality of semiconductor structures is separated from each other.

BRIEF DESCRIPTION OF THE DRAWINGS

FIG. 6B illustrates a cross-sectional view taken along line X1'-X1" of FIG. 6A;

DETAILED DESCRIPTION OF PREFERRED EMBODIMENTS

Figure 1:
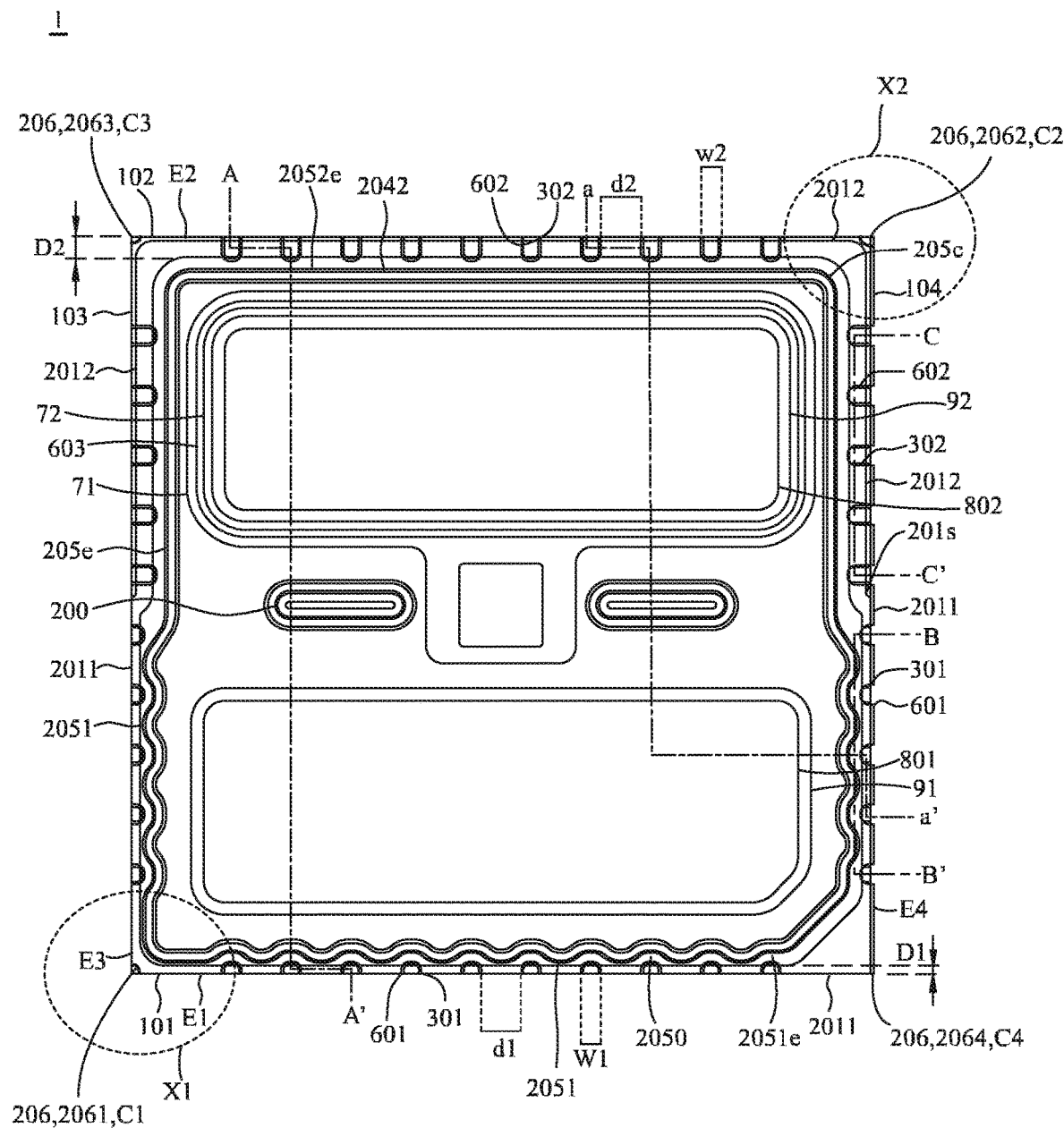
FIG. 1 illustrates a top view of a light-emitting device 1 in accordance with an embodiment of the present application.

The embodiment of the application is illustrated in detail, and is plotted in the drawings. The same or the similar part is illustrated in the drawings and the specification with the same number.

Figure 2:
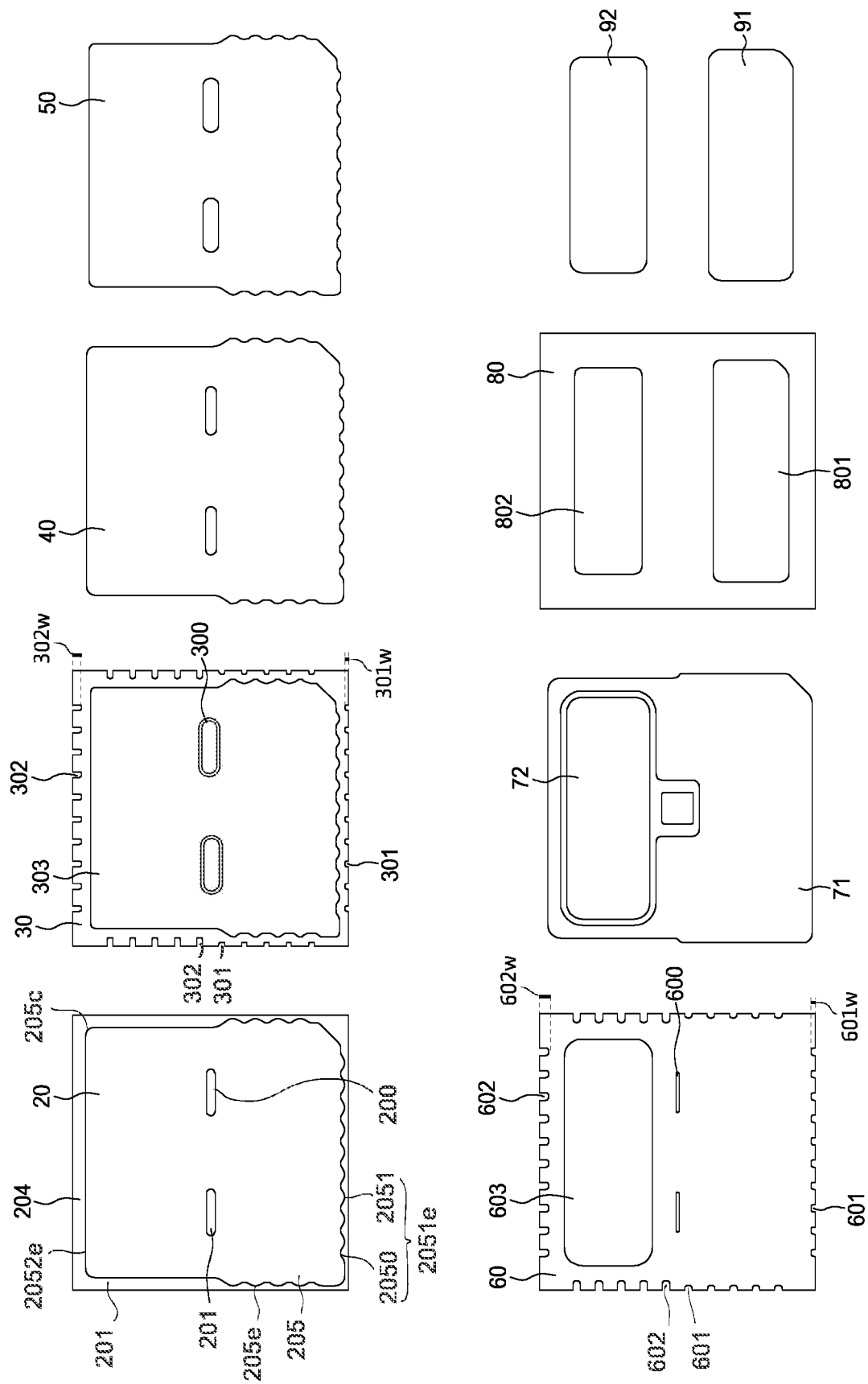
FIG. 2 illustrates a top view pattern of each layer of the light-emitting device 1 in accordance with an embodiment of the present application.
Figure 3:
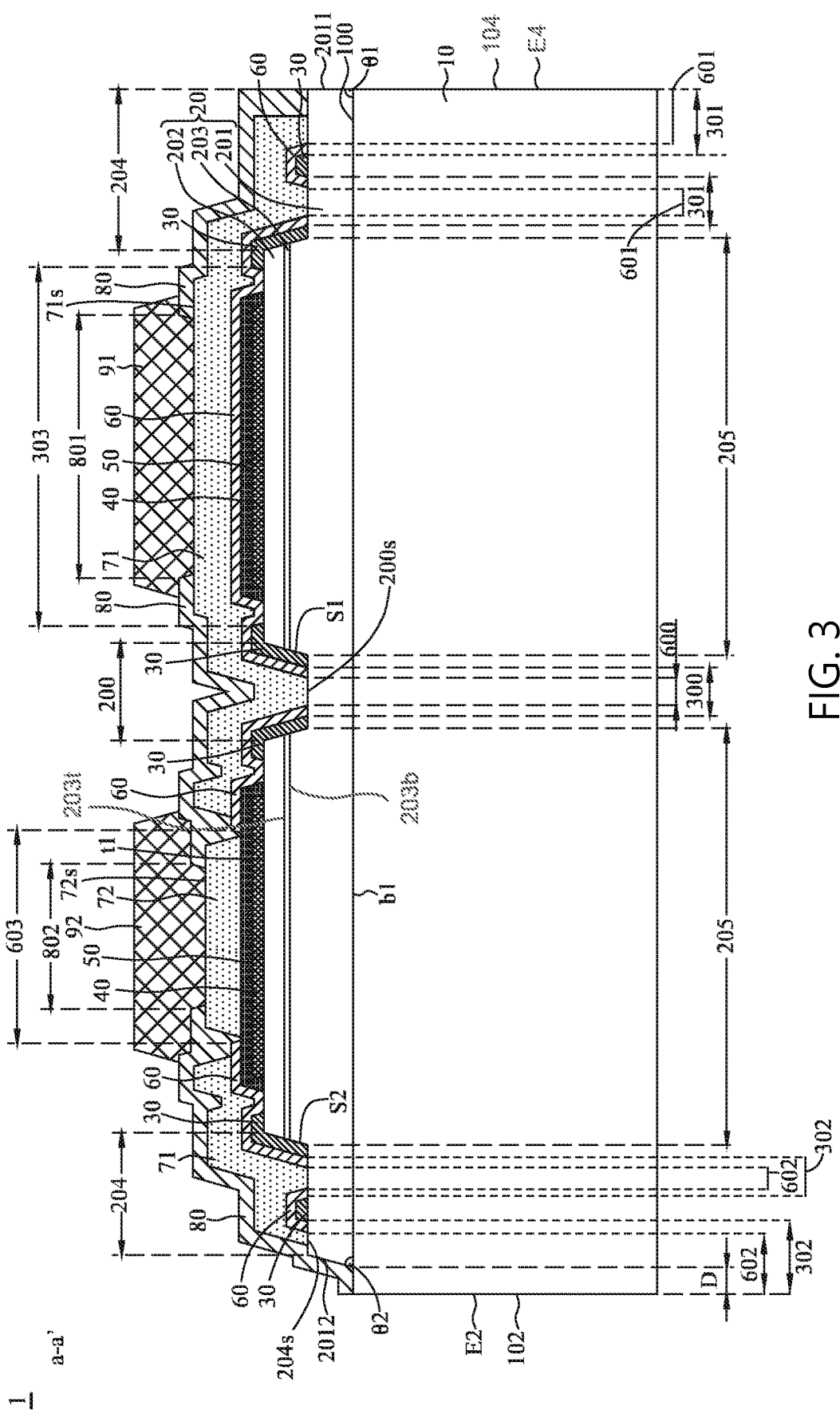
FIG. 3 illustrates a cross-sectional view taken along line a-a' of FIG. 1.
Figure 3A:
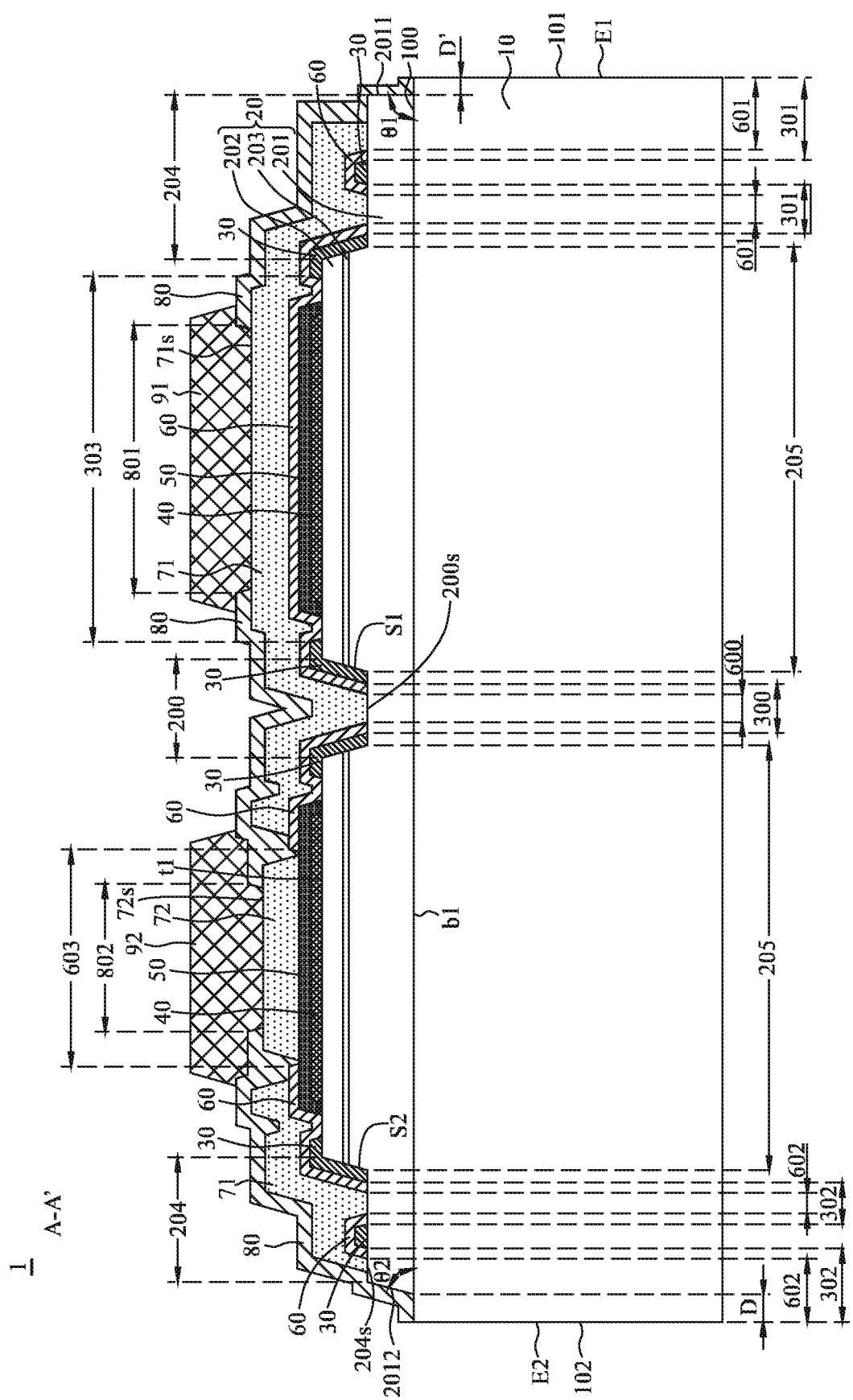
FIG. 3A illustrates a cross-sectional view taken along line A-A' of FIG. 1.
Figure 4:
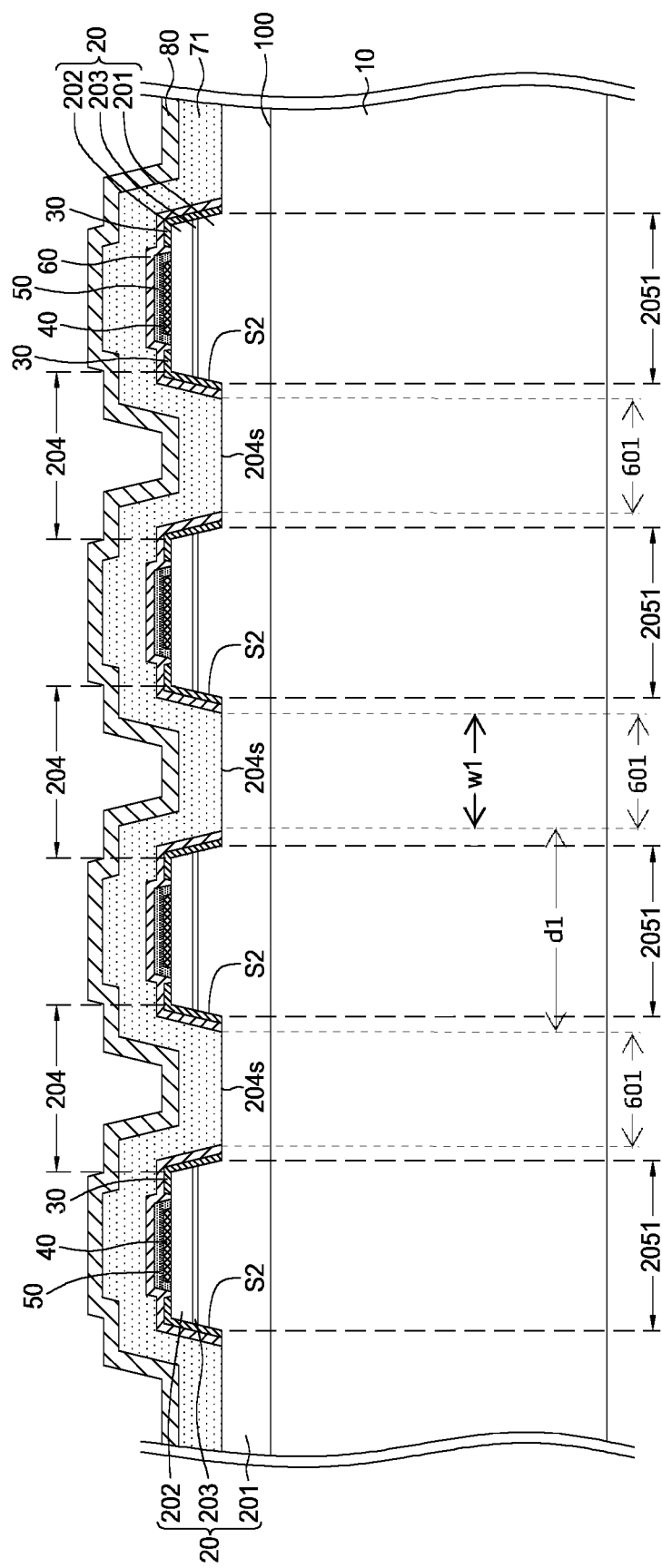
FIG. 4 illustrates a cross-sectional view taken along line B-B' of FIG. 1.
Figure 5:
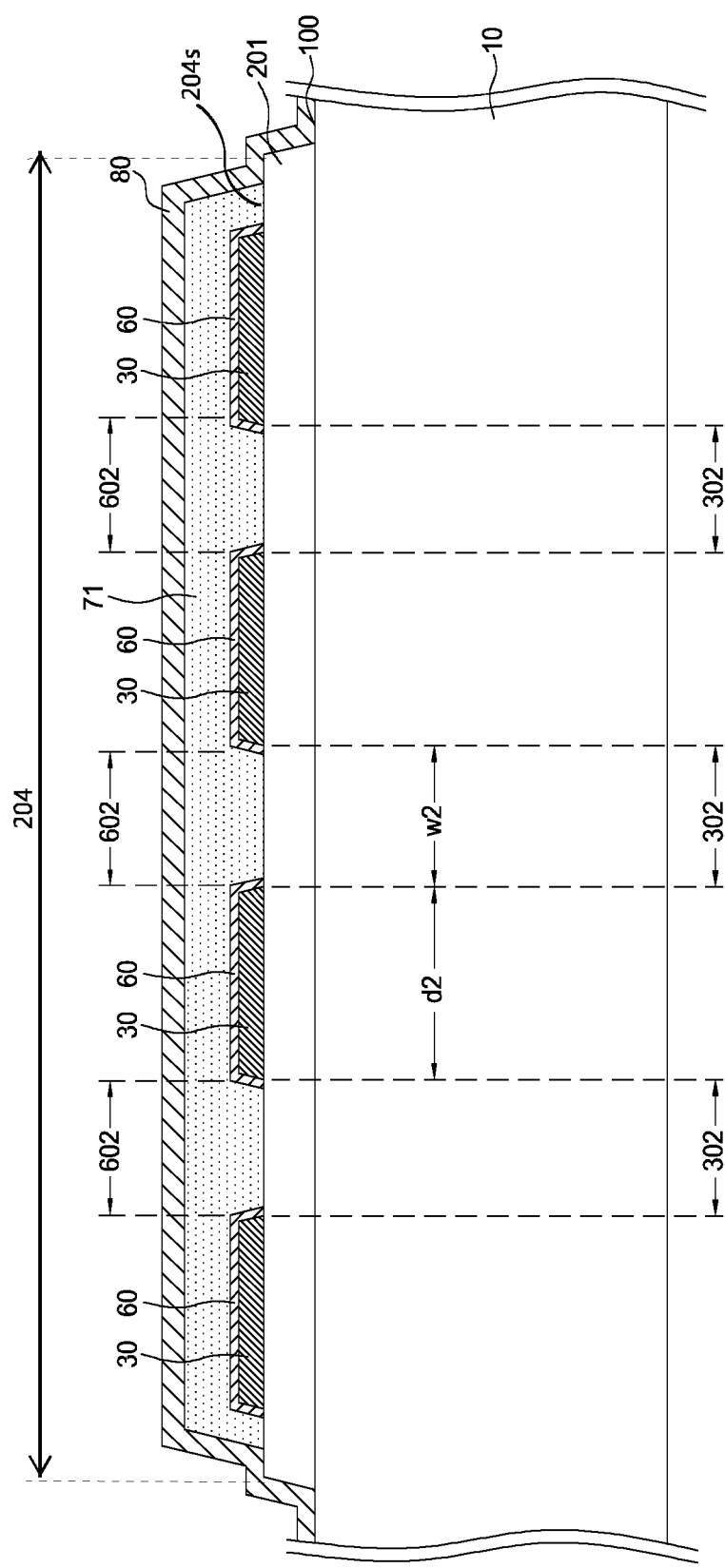
FIG. 5 illustrates a cross-sectional view taken along line C-C' of FIG. 1.

FIG. 1 illustrates a top view of a light-emitting device 1 in accordance with an embodiment of the present application. FIG. 2 illustrates a top view pattern of each layer of the light-emitting device 1 in accordance with an embodiment of the present application. FIG. 3 illustrates a cross-sectional view taken along line a-a' of FIG. 1. FIG. 3A illustrates a cross-sectional view taken along line A-A' of FIG. 1. FIG. 4 illustrates a cross-sectional view taken along line B-B' of FIG. 1. FIG. 5 illustrates a cross-sectional view taken along line C-C' of FIG. 1. The light extraction efficiency of the light-emitting device 1 in the present application is improved.

As shown in FIG. 1, FIG. 3 and FIG. 3A, a light-emitting device 1 includes a substrate 10 including a top surface 100, a first side surface 101, a second side surface 102, a third side surface 103 and a fourth side surface 104. The first side surface 101 and the second side surface 102 of the substrate 10 are located at two opposite sides of the top surface 100 of the substrate 10 and not parallel to the top surface 100, and the third side surface 103 and the fourth side surface 104 of the substrate 10 are located at another two opposite sides of the top surface 100 of the substrate 10 and not parallel to the top surface 100. The first side surface 101, the second side surface 102, the third side surface 103 and the fourth side surface 104 form a periphery of the substrate 10.

The light-emitting device 1 includes a semiconductor stack 20 formed on the top surface 100 of the substrate 10. The semiconductor stack 20 includes a first semiconductor layer 201, a second semiconductor layer 202, and an active layer 203 formed between the first semiconductor layer 201 and the second semiconductor layer 202.

In an embodiment of the present application, the substrate 10 can be a growth substrate, including gallium arsenide (GaAs) wafer for growing aluminum gallium indium phosphide (AlGaInP), or sapphire (Al$_2$O$_3$) wafer, gallium nitride (GaN) wafer, silicon carbide (SiC) wafer or aluminum nitride (AlN) wafer for growing gallium nitride (GaN), indium gallium nitride (InGaN) or aluminum gallium nitride (AlGaN).

In an embodiment of the present application, a semiconductor stack 20 including optical characteristics and semiconductor materials is formed on the substrate 10 by metal organic chemical vapor deposition (MOCVD), molecular beam epitaxy (MBE), hydride vapor deposition (HVPE), physical vapor deposition (PVD), or ion plating, wherein physical vapor deposition (PVD) includes sputtering or evaporation.

The wavelength of the light emitted from the light-emitting device 1 is adjusted by changing the physical and chemical composition of one or more layers in the semiconductor stack 20. The material of the semiconductor stack 20 includes a group III-V semiconductor material, such as Al$_x$In$_y$Ga$_{(1-y-x)}$N or Al$_x$In$_y$Ga$_{(1-x-y)}$P, wherein 0≤x, y≤1; (x+y)≤1. According to the material of the active layer 203, when the material of the semiconductor stack 20 is AlInGaP series material, red light having a wavelength between 610 nm and 650 nm or yellow light having a wavelength between 550 nm and 570 nm can be emitted. When the material of the semiconductor stack 20 is InGaN series material, blue or deep blue light having a wavelength between 400 nm and 490 nm or green light having a wavelength between 490 nm and 550 nm can be emitted. When the material of the semiconductor stack 20 is AlGaN series material, UV light having a wavelength between 400 nm and 250 nm can be emitted.

The first semiconductor layer 201 and the second semiconductor layer 202 can be cladding layers, and have different conductivity types, electrical properties, polarities, or doping elements for providing electrons or holes. For example, the first semiconductor layer 201 is an n-type semiconductor and the second semiconductor layer 202 is a p-type semiconductor. The active layer 203 is formed between the first semiconductor layer 201 and the second semiconductor layer 202. The electrons and holes combine in the active layer 203 under a current driving to convert electric energy into light which is then emitted from the active layer 203. The active layer 203 can be a single heterostructure (SH), a double heterostructure (DH), a double-side double heterostructure (DDH), or a multi-quantum well structure (MQW). The material of the active layer 203 can be i-type, p-type, or n-type semiconductor. The first semiconductor layer 201, the second semiconductor layer 202 or the active layer 203 can be a single layer or a structure including a plurality of layers.

As shown in FIG. 2 and FIG. 3, the semiconductor stack 20 is selectively etched to form a via 200, a recess 204 and a semiconductor mesa 205 on the semiconductor stack 20. For example, a photoresist pattern of the via 200, the recess 204 and the semiconductor mesa 205 is formed by coating a photoresist and then removing a portion of the photoresist through a lithography process. The photoresist pattern is provided to form the via 200, the recess 204 and the semiconductor mesa 205. Specifically, the semiconductor mesa 205 is formed by removing portions of the second semiconductor layer 202 and the active layer 203 to form a structure including the first semiconductor layer 201, the second semiconductor layer 202, and the active layer 203. The via 200 and the recess 204 are formed by removing portions of the second semiconductor layer 202 and the active layer 203 to respectively expose the first semiconductor layer 201. The remaining photoresist pattern is removed after the etching process.

As shown in FIG. 3, the semiconductor mesa 205 includes an upper surface t1 and a lower surface b1. The active layer 203 includes a first upper surface 203t and a second lower surface 203b, wherein the first upper surface 203t of the active layer 202 is closer to the upper surface t1 of the semiconductor mesa 205 than the second lower surface 203b of the active layer 202 to the upper surface t1 of the semiconductor mesa 205. A first thickness is between the upper surface t1 of the semiconductor mesa 205 and the first upper surface 203t of the active layer 203, a second thickness is between the lower surface b1 of the semiconductor mesa 205 and the second lower surface 203b of the active layer 203, and the second thickness is greater than the first thickness.

As shown in FIG. 1, in a top view of the light-emitting device 1, the substrate 10 of the light-emitting device 1 includes a plurality of corners and a plurality of edges, wherein any one of the corners is constituted by two adjacent edges. The plurality of corners includes a first corner C1, a second corner C2, a third corner C3, and a fourth corner C4. The plurality of edges includes a first edge E1, a second edge E2, a third edge E3, and a fourth edge E4.

As shown in FIG. 1 and FIG. 2, an outer periphery 205e of the semiconductor mesa 205 includes a first outer periphery 2051e adjacent to the first edge E1 and a second outer periphery 2052e adjacent to the second edge E2. In order to increase the light emitting area and the light extraction efficiency of the light-emitting device 1, the first outer periphery 2051e adjacent to the first edge E1 includes a first plurality of concave parts 2050 and a first plurality of convex parts 2051 as compared with the second outer periphery 2052e adjacent to the second edge E2. A first plurality of concave parts 2050 and a first plurality of convex parts 2051 are alternately arranged.

As shown in FIG. 1, a first space D1 between one side of the convex part 2051 of the first outer periphery 2051e and the first edge E1 is smaller than a second space D2 between the second outer periphery 2052e and the second edge E2.

A contour formed by the first plurality of concave parts 2050 and the first plurality of convex parts 2051 constitute a first outer periphery 2051e. In the top view of the light-emitting device 1, the first outer periphery 2051e includes a shape including wavy, zigzag or square. The position of the opening of the insulating layer, the contact layer, or the electrode layer subsequently formed may be determined according to the position arrangement of the first plurality of concave parts 2050 and the first plurality of convex parts 2051. The light extraction efficiency of the light-emitting device can be improved by the pattern design on the side surface of the semiconductor stack 20.

As shown in FIG. 1 and FIG. 2, the corner 205c of the semiconductor mesa 205 can be rounded to avoid the electrical current locally crowding in the corner of the light-emitting device 1.

As shown in FIG. 2, the recess 204 is located at an outermost side of the semiconductor stack 20, wherein the recess 204 continuously or discontinuously exposes the first semiconductor layer 201 of the outermost side of the semiconductor stack 20 to continuously or discontinuously surround a portion of the first semiconductor layer 201, the second semiconductor layer 203, and the active layer 202 of the semiconductor mesa 205.

In another embodiment (not shown), the recess 204 discontinuously exposes the first semiconductor layer 201 of the outermost side of the semiconductor stack 20 to discontinuously surround a portion of the first semiconductor layer 201, the second semiconductor layer 203, and the active layer 202 of the semiconductor mesa 205.

As shown in FIG. 1 and FIG. 2, the via 200 is located inside the semiconductor stack 20 and is surrounded by the recess 204. In other words, the via 200 is surrounded by a portion of the first semiconductor layer 201, the second semiconductor layer 202, and the active layer 203. In the top view of the light-emitting device 1, the shape of the via 200 can be an ellipse, a circle, a rectangle, or any other shapes.

The light-emitting device 1 includes a plurality of vias 200, and the amount and the arrangement of the plurality of vias 200 are not limited. The plurality of vias 200 may be regularly arranged with a regular interval so that an electrical current can be uniformly spread along the horizontal direction. The plurality of via 200 may be arranged in a plurality of columns to form an array. The vias 200 between any two adjacent columns or between every two adjacent columns may be aligned with or staggered from each other. The position of the contact layer and the electrode layer subsequently formed can be determined according to the arrangement of the plurality of vias 200.

As shown in FIG. 3, the via 200 includes a first surface S1 having an angle within a range with respect to the inner surface 200s of the first semiconductor layer 201, wherein the angle is between 10 and 80 degrees. The recess 204 includes a second surface S2 having an angle within a range with respect to the outer surface 204s of the first semiconductor layer 201, wherein the angle is between 10 and 80 degrees. If the angle is less than 10 degrees, an excessively low slope reduces the area of the active layer 202, and a decreased area of the active layer 202 decreases the luminance of the light-emitting device 1. If the angle is greater than 80 degrees, the insulating layer and the metal layer subsequently formed may not completely cover the sidewalls of the first semiconductor layer 201, the second semiconductor layer 202, and/or the active layer 203, thereby causing cracking of the films.

In an embodiment of the present application, the second surface S2 includes an angle between 20 degrees and 75 degrees, preferably between 30 degrees and 65 degrees, and more preferably between 40 degrees and 55 degrees with respect to the outer surface 204s of the first semiconductor layer 201.

FIG. 3 illustrates a cross-sectional view taken along line a-a' of FIG. 1. As shown in FIG. 3, the first semiconductor layer 201 adjacent to the fourth edge E4 includes a first sidewall 2011 connected to the top surface 100 of the substrate 10 or directly connected to the fourth side surface 104 of the substrate 10. The first semiconductor layer 201 adjacent to the second edge E2 includes a second sidewall 2012 inclined to the top surface 100 of the substrate 10 and spaced apart from the second side surface 102 of the substrate 10 by a first distance D to expose a portion of the top surface 100 of the substrate 10.

FIG. 3A illustrates a cross-sectional view taken along line A-A' of FIG. 1. As shown in FIG. 3A, the first semiconductor layer 201 adjacent to the first edge E1 includes a first sidewall 2011 connected to the top surface 100 of the substrate 10, and spaced apart from the first side surface 101 of the substrate 10 by a second distance D' to expose a portion of the top surface 100 of the substrate 10. The first semiconductor layer 201 adjacent to the second edge E2 includes a second sidewall 2012 inclined to the top surface 100 of the substrate 10 and spaced apart from the second side surface 102 of the substrate 10 by a first distance D to expose a portion of the top surface 100 of the substrate 10. The second distance D' is smaller than the first distance D.

In an embodiment of the present application, as shown in FIG. 1, the first semiconductor layer 201 includes a plurality of first sidewalls 2011 and a plurality of second sidewalls 2012 to form a periphery of the first semiconductor layer 201. The plurality of first sidewalls 2011 is respectively located adjacent to the first edge E1, the third edge E3, and the fourth edge E4, and the plurality of second side walls 2012 is respectively located adjacent to the second edge E2, the third edge E3, and the fourth edge E4. In a top view of the light-emitting device 1, one of the plurality of first sidewalls 2011 adjacent to the third edge E3 and the fourth edge E4 is connected to one of the plurality of second sidewalls 2012 by a sidewall 201s. The sidewall 201s can be a flat surface or a curve surface. Two ends of the sidewall 201s are respectively connected to the first sidewall 2011 and the second sidewall 2012 with an angle to increase the light extraction efficiency of the light-emitting device 1.

In an embodiment of the present application, the first sidewall 2011 adjacent to the first edge E1 is spaced apart from the first side surface 101 of the substrate 10 by a second distance D' to expose a portion of the top surface 100 of the substrate 10. The second sidewall 2012 adjacent to the second edge E2 is spaced apart from the second side surface 102 of the substrate 10 by a first distance D to expose a portion of the top surface 100 of the substrate 10. The second distance D' is smaller than the first distance D. The first sidewalls 2011 adjacent to the third edge E3 and the fourth edge E4 are directly connected to the third side surface 103 and the fourth side surface 104 of the substrate 10, respectively. The second sidewalls 2012 adjacent to the third edge E3 and the fourth edge E4 are respectively inclined to the top surface 100 of the substrate 10 and spaced apart from the second side surface 102 of the substrate 10 by a first distance D to expose a portion of the top surface 100 of the substrate 10.

In an embodiment of the present application (not shown), the first sidewalls 2011 adjacent to the first edge E1, the third edge E3, and the fourth edge E4 are directly connected to the first side surface 101, the third side surface 103, and the fourth side surface 104 of the substrate 10, respectively. The second sidewalls 2012 adjacent to the second edge E2, the third edge E3, and the fourth edge E4 are respectively inclined to the top surface 100 of the substrate 10, and are spaced apart from the second side surface 102, the third side surface 103, and the fourth side surface 104 of the substrate 10 by a first distance D to expose a portion of the top surface 100 of the substrate 10.

In an embodiment of the present application (not shown), the plurality of first sidewalls 2011 is respectively adjacent to the first edge E1 and the third edge E3, and the plurality of second side walls 2012 is respectively adjacent to the second edge E2 and the fourth edge E4. The sidewalls 201s are respectively located at the third corner C3 and the fourth corner C4 with an oblique angle, and are respectively connected to the first sidewall 2011 and the second sidewall 2012.

In an embodiment of the present application, as shown in FIG. 1, the plurality of first sidewalls 2011 and the plurality of second sidewalls 2012 may be adjusted in accordance with the shape of the light-emitting device 1, such as a circle, a triangle, a hexagon, a rectangle, or a square. In an embodiment of the present application, the positions of the plurality of first sidewalls 2011 and the plurality of second sidewalls 2012 can be adjusted according to the user design, and is not limited by the above described. Based on the subsequent processes, for example, an area surrounded by the plurality of first sidewalls 2011 and the plurality of second sidewalls 2012 can accommodate the electrode pad subsequently formed.

In an embodiment of the present application, as shown in FIG. 3, the first distance D is preferably larger than 5 μm and less than 50 μm, more preferably less than 30 μm. The top surface 100 of the substrate 10 exposed by the first distance D is a rough surface. The rough surface may be a surface having an irregular shape or a surface having a regular shape. The irregular shape includes a plurality of pattern units having different shapes or intervals, and the regular shape includes a plurality of pattern units having substantially the same shape or interval. The rough surface includes a plurality of hemispherical shapes protruding or recessed from the top surface 100, a surface having a plurality of cones protruding or recessed from the top surface 100, or a surface having a plurality of pyramids protruding or recessed from the top surface 100.

As shown in FIG. 3, a first angle θ1 is between the first sidewall 2011 of the first semiconductor layer 201 and the top surface 100 of the substrate 10, and a second angle θ2 is between the second sidewall 2012 of the first semiconductor layer 201 and the top surface 100 of the substrate 10, and the second angle θ2 is different from the first angle θ1.

In an embodiment of the present application, the first angle θ01 is larger than the second angle θ2.

In an embodiment of the present application, the first angle θ1 is between 70 and 90 degrees. The second angle θ2 is between 20 and 70 degrees.

In an embodiment of the present application, the angle difference between the first angle θ1 and the second angle θ2 is larger than 20 degrees.

Figure 16:
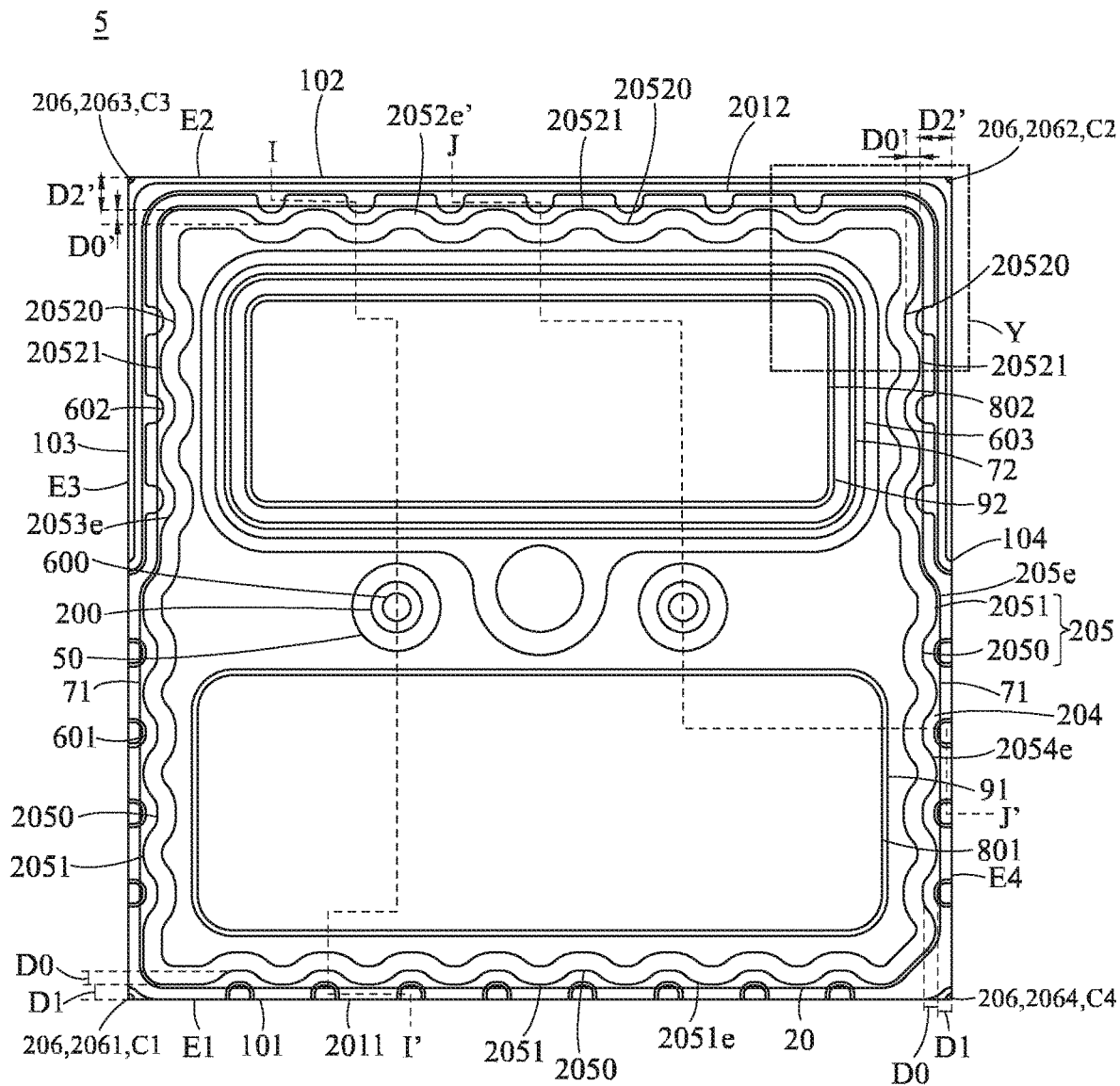
FIG. 16 illustrates a top view of a light-emitting device 5 in accordance with an embodiment of the present application.
Figure 17:
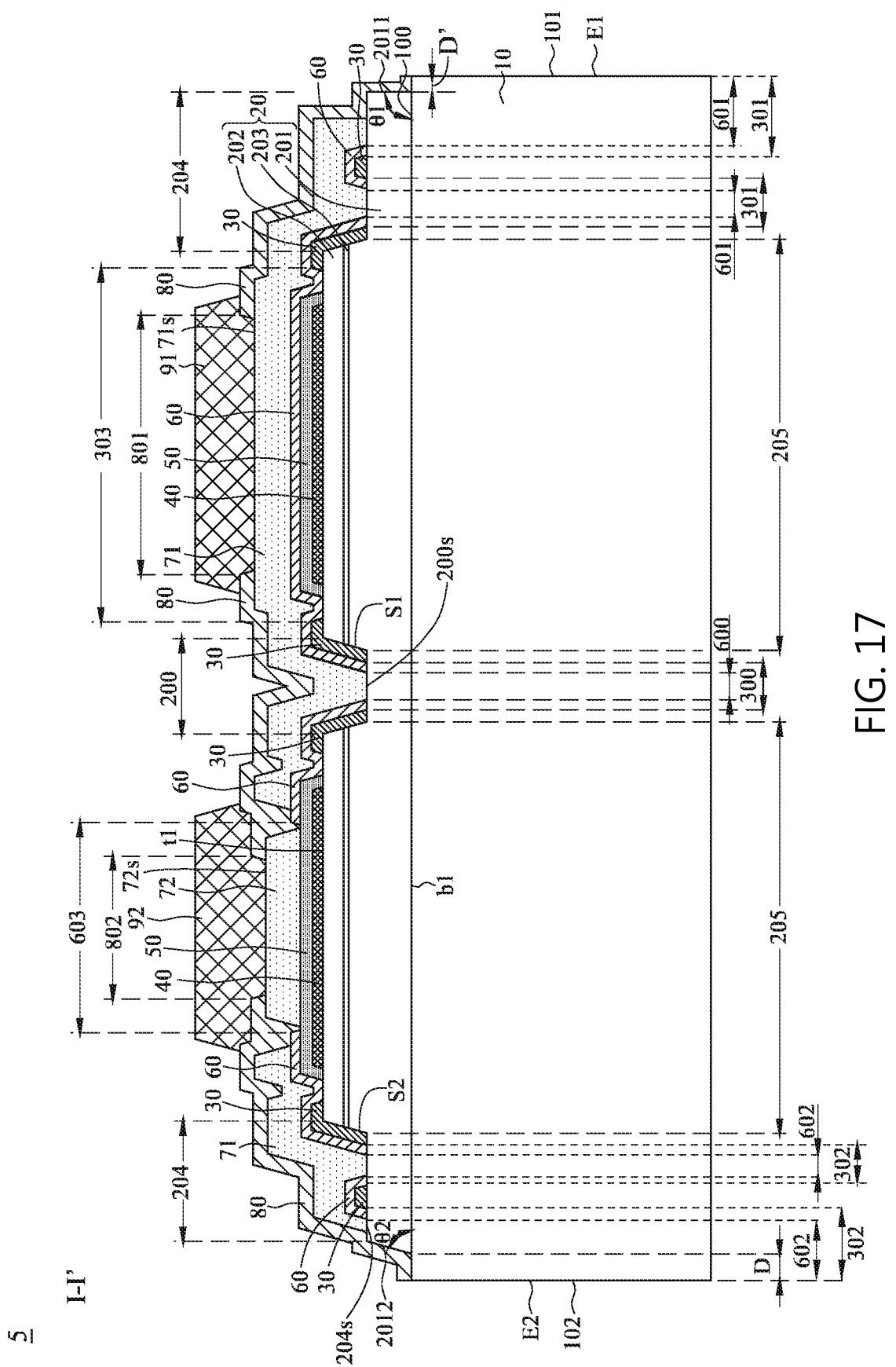
FIG. 17 illustrates a cross-sectional view taken along line I-I' of FIG. 16.
Figure 18:
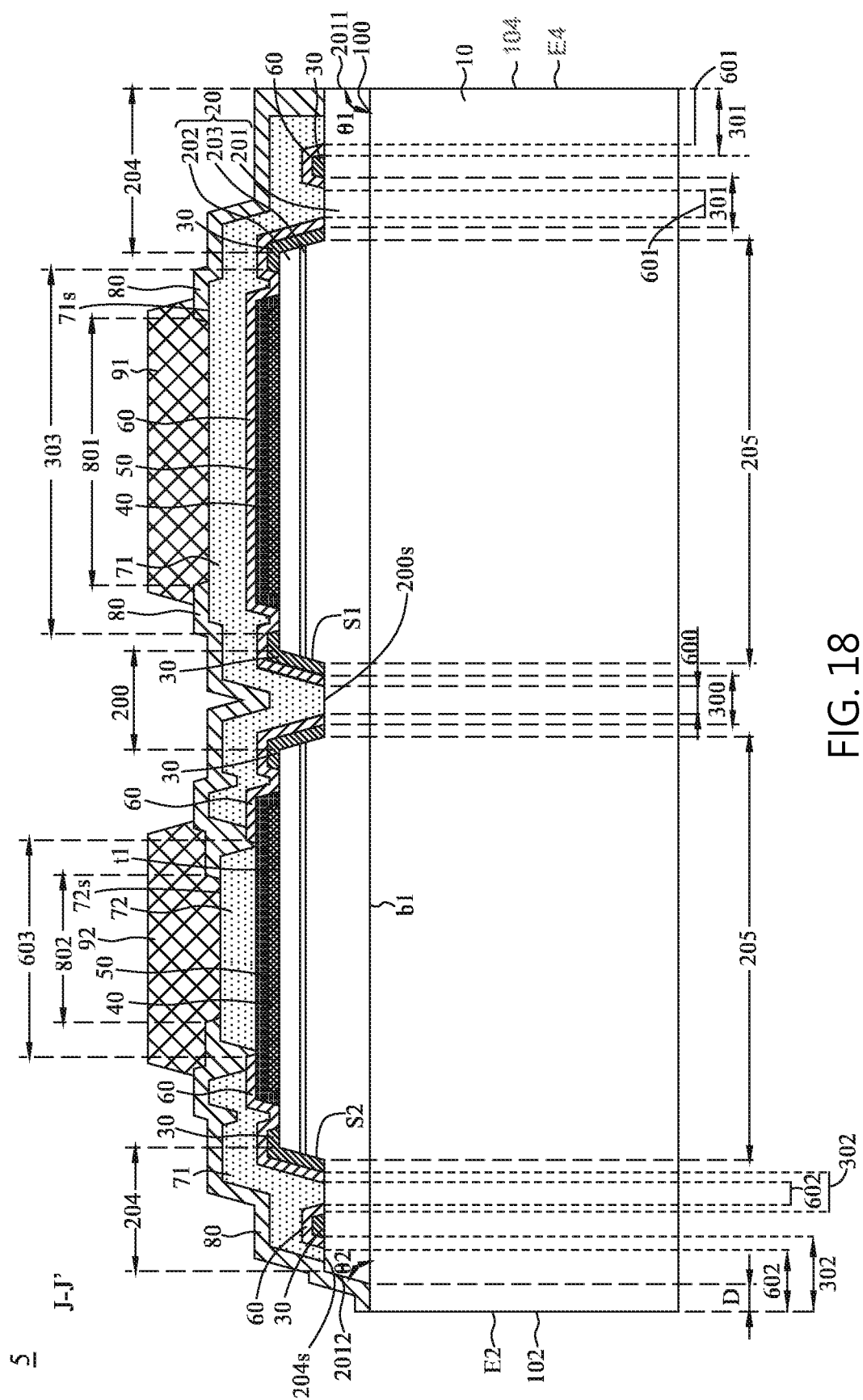
FIG. 18 illustrates a cross-sectional view taken along line J-J' of FIG. 16.

FIG. 16 illustrates a top view of a light-emitting device 5 in accordance with an embodiment of the present application. FIG. 17 illustrates a cross-sectional view taken along line I-I' of FIG. 16. FIG. 18 illustrates a cross-sectional view taken along line J-J' of FIG. 16. The light-emitting device 5 and the light-emitting device 1 substantially include the same structure, the same designations and numbers of the light-emitting device 5 illustrated in FIGS. 16~18 and the light-emitting device 1 illustrated in FIGS. 1~6D include the same material, or the same function, and the related descriptions will be properly omitted.

A light-emitting device 5 includes a substrate 10 including a top surface 100, a first side surface 101, a second side surface 102, a third side surface 103 and a fourth side surface 104. The first side surface 101 and the second side surface 102 of the substrate 10 are located at two opposite sides of the top surface 100 of the substrate 10 and not parallel to the top surface 100, and the third side surface 103 and the fourth side surface 104 of the substrate 10 are located at another two opposite sides of the top surface 100 of the substrate 10 and not parallel to the top surface 100. The first side surface 101, the second side surface 102, the third side surface 103, and the fourth side surface 104 form a periphery of the substrate 10.

As shown in FIG. 16, in a top view of the light-emitting device 5, the substrate 10 of the light-emitting device 5 includes a plurality of corners and a plurality of edges, wherein any one of the corners is constituted by two adjacent edges. The plurality of corners includes a first corner C1, a second corner C2, a third corner C3, and a fourth corner C4. The plurality of edges includes a first edge E1, a second edge E2, a third edge E3, and a fourth edge E4.

An outer periphery 205e of the semiconductor mesa 205 includes a first outer periphery 2051e adjacent to the first edge E1; a second outer periphery 2052e' adjacent to the second edge E2; a third outer periphery 2053e adjacent to the third edge E3; and a fourth outer periphery 2054e adjacent to the fourth edge E4.

In order to increase the light emitting area and the light extraction efficiency of the light-emitting device 5, the first outer periphery 2051e adjacent to the first edge E1 includes a first plurality of concave parts 2050 and a first plurality of convex parts 2051. A first plurality of concave parts 2050 and a first plurality of convex parts 2051 are alternately arranged. The second outer periphery 2052e' adjacent to the second edge E2 includes a second plurality of concave parts 20520 and a second plurality of convex parts 20521. The second plurality of concave parts 20520 and the second plurality of convex parts 20521 are alternately arranged. The first plurality of concave parts 2050 and the second plurality of concave parts 20520 include different curvature radii in the top view of the light-emitting device 5. The first plurality of convex parts 2051 and the second plurality of convex parts 20521 include different curvature radii in the top view of the light-emitting device 5. In the top view of the light-emitting device 5, the first outer periphery 2051e and the second outer periphery 2052e' include wavy shape, zigzag shape, or square shape.

In the top view of the light-emitting device 5, an amount of the plurality of concave parts 2050 is larger than that of the second plurality of concave parts 20520. An amount of the plurality of convex parts 2051 is larger than that of the second plurality of convex parts 20521.

One portion of the third outer periphery 2053e of the third edge E3 near the first edge E1 includes a plurality of concave parts 2050 and a plurality of convex parts 2051, wherein the plurality of concave parts 2050 and the plurality of convex parts 2051 are continuously and alternately arranged. In an embodiment, the contour of the third outer periphery 2053e formed by the plurality of concave parts 2050 and the plurality of convex parts 2051 is the same as or different from the contour of the first outer periphery 2051e formed by the plurality of concave parts 2050 and the plurality of convex parts 2051.

Another portion of the third outer periphery 2053e of the third edge E3 near the second edge E2 includes the second plurality of concave parts 20520 and the second plurality of convex parts 20521, wherein the second plurality of concave parts 20520 and the second plurality of convex parts 20521 are continuously and alternately arranged. In an embodiment, the contour of the third outer periphery 2053e formed by the second plurality of concave parts 20520 and the second plurality of convex parts 20521 is the same as or different from the contour of the second outer periphery 2052e' formed by the second plurality of concave parts 20520 and the second plurality of convex parts 20521. The plurality of concave parts 2050, the plurality of convex parts 2051, the second plurality of concave parts 20520 and the second plurality of convex part 20521 are continuously and alternately arranged to form the contour of the third outer periphery 2053e. The first plurality of concave parts 2050 and the second plurality of concave parts 20520 include different curvature radii in the top view of the light-emitting device 5. The first plurality of convex parts 2051 and the second plurality of convex parts 20521 include different curvature radii in the top view of the light-emitting device 5. In the top view of the light-emitting device 5, the contour of the third outer periphery 2053e may be a wave shape, a zigzag shape or a square wave shape.

One portion of the fourth outer periphery 2054e of the fourth edge E4 near the first edge E1 includes the plurality of concave parts 2050 and the plurality of convex parts 2051, wherein the plurality of concave parts 2050 and the plurality of convex parts 2051 are continuously and alternately arranged. In an embodiment, the contour of the fourth outer periphery 2054e formed by the plurality of concave parts 2050 and the plurality of convex parts 2051 is the same as or different from the contour of the first outer periphery 2051e formed by the plurality of concave parts 2050 and the plurality of convex parts 2051.

Another portion of the fourth outer periphery 2054e of the fourth edge E4 near the second edge E2 includes the second plurality of concave parts 20520 and the second plurality of convex parts 20521, wherein the second plurality of concave parts 20520 and the second plurality of convex parts 20521 are continuously and alternately arranged. In an embodiment, the contour of the fourth outer periphery 2054e formed by the second plurality of concave parts 20520 and the second plurality of convex parts 20521 is the same as or different from the contour of the second outer periphery 2052e' formed by the second plurality of concave parts 20520 and the second plurality of convex parts 20521. The plurality of concave parts 2050, the plurality of convex parts 2051, the second plurality of concave parts 20520 and the second plurality of convex parts 20521 are continuously and alternately arranged to form the contour of the fourth outer periphery 2054e. The first plurality of concave parts 2050 and the second plurality of concave parts 20520 include different curvature radii in the top view of the light-emitting device 5. The first plurality of convex parts 2051 and the second plurality of convex parts 20521 include different curvature radii in the top view of the light-emitting device 5. In the top view of the light-emitting device 5, the contour of the fourth outer periphery 2054e may be a wave shape, a zigzag shape or a square wave shape.

As shown in FIG. 16, a first space D1 between one side of the convex mesa 2051 of the first outer periphery 2051e and the first edge E1 is smaller than a second space D2' between one side of the convex mesa 20521 of the second outer periphery 2052e and the second edge E2.

In the top view of the light-emitting device 5, a third space D0 is between a side of the convex mesa 2051 of the first outer periphery 2051e and a side of the concave part 2050 of the first outer periphery 2051e. A fourth space D0' is between the second plurality of concave parts 20520 and the second plurality of the convex parts 20521 of the second outer periphery 2052e'. In an embodiment of the present application, the third space D0 and the fourth space D0' include same distance. In another embodiment of the present application, the third space D0 and the fourth space D0' include different distances.

In accordance with the positions of the plurality of concave parts 2050, the plurality of convex parts 2051, the second plurality of concave parts 20520 and the plurality of convex parts 20521, the positions of the opening of the insulating layer, the contact layer, or the electrode layer subsequently formed can be determined. The light extraction efficiency of the light-emitting device 5 can be improved by the pattern design on the side surface of the semiconductor stack 20.

The recess 204 is located at an outermost side of the semiconductor stack 20, wherein the recess 204 continuously or discontinuously exposes the first semiconductor layer 201 of the outermost side of the semiconductor stack 20 to continuously or discontinuously surround the second semiconductor layer 203 and the active layer 202 of the semiconductor mesa 205.

The via 200 is located inside the semiconductor stack 20 and is surrounded by the recess 204. In other words, the via 200 is surrounded by the second semiconductor layer 202 and the active layer 203. In the top view of the light-emitting device 5, the via 200 includes an elliptical shape, a circular shape, a rectangular shape, or any other shape.

As shown in FIG. 17, the first semiconductor layer 201 adjacent to the first edge E1 includes a first sidewall 2011 connected to the top surface 100 of the substrate 10, and spaced apart from the first side surface 101 of the substrate 10 by a second distance D' to expose a portion of the top surface 100 of the substrate 10. The first semiconductor layer 201 adjacent to the second edge E2 includes a second sidewall 2012 inclined to the top surface 100 of the substrate 10 and spaced apart from the second side surface 102 of the substrate 10 by a first distance D to expose a portion of the top surface 100 of the substrate 10. The second distance D' is smaller than the first distance D.

As shown in FIG. 18, the first semiconductor layer 201 adjacent to the fourth edge E4 includes a first sidewall 2011 connected to the top surface 100 of the substrate 10, and directly connected to the fourth side surface 104 of the substrate 10. The first semiconductor layer 201 adjacent to the second edge E2 includes a second sidewall 2012 inclined to the top surface 100 of the substrate 10 and spaced apart from the second side surface 102 of the substrate 10 by a first distance D to expose a portion of the top surface 100 of the substrate 10.

The first distance D is preferably larger than 5 μm and less than 50 μm, more preferably less than 30 μm. The top surface 100 exposed by the first distance D is a rough surface. The rough surface may be a surface having an irregular shape or a surface having a regular shape. The irregular shape includes a plurality of pattern unit having different shapes or intervals, and the regular shape includes a plurality of pattern unit having substantially same shape or interval. The rough surface includes a plurality of hemispherical shapes protruding or recessed from the top surface 100, a surface having a plurality of cones protruding or recessed from the top surface 100, or a surface having a plurality of pyramids protruding or recessed from the top surface 100.

The structure of the third edge E3 and the structure of the fourth edge E4 of the light-emitting device 5 is substantially the same as the third edge E3 and the structure of the fourth edge E4 of the light-emitting device 1. The side surface structure of the first semiconductor layer 201 adjacent to the third edge E3 of the light-emitting device 5 includes the first sidewall 2011 and the second sidewall 2012, wherein the first sidewall 2011 is directly connected to the third side surface 103 of the substrate 10, and the second sidewall 2012 is inclined to the top surface 100 of the substrate 10 and spaced apart from the third side surface 103 of the substrate 10 by a first distance D to expose a portion of the top surface 100 of the substrate 10. And, the second sidewall 2012 is closer to the second edge E2 than the first sidewall 2011 to the second edge E2. The side surface structure of the first semiconductor layer 201 adjacent to the fourth edge E4 of light-emitting device 5 includes the first sidewall 2011 and the second sidewall 2012, wherein the first sidewall 2011 is directly connected to the fourth side surface 104 of the substrate 10, and the second sidewall 2012 is inclined to the top surface 100 of the substrate 10 and spaced apart from the fourth side surface 104 of the substrate 10 by a first distance D to expose a portion of the top surface 100 of the substrate 10. And, the second sidewall 2012 is closer to the second edge E2 than the first sidewall 2011 to the second edge E2.

As shown in FIG. 1, FIG. 2, FIG. 3, FIG. 17 and FIG. 18, a first insulating layer 30 is formed on the semiconductor stack 20. An opening 300 of the first insulating layer 30 is formed in the via 200 by selectively etching the first insulating layer 30 to expose the first semiconductor layer 201 on the via 200. One or a plurality of first openings 301 of the first insulating layer 30 are formed on the recess 204 adjacent to the first edge E1 to expose the first semiconductor layer 201 on the recess 204. One or a plurality of second openings 302 of the first insulating layer 30 are formed on the recess 204 adjacent to the second edge E2 to expose the first semiconductor layer 201 on the recess 204. A third opening 303 of the first insulating layer 30 is formed on the second semiconductor layer 202. The first insulating layer 30 adjacent to the opening 300 of the first insulating layer 30 covers portions of the second semiconductor layer 202 beyond the via 200 and covers the first surface S1 of the via 200. The first insulating layer 30 adjacent to the recess 204 covers portions of the second semiconductor layer 202 beyond the recess 204 and covers the second surface S2 of the recess 204.

As shown in FIG. 1 and FIG. 2, in order to provide same areas of the first semiconductor layer 201 exposed by the first opening 301 of the first insulating layer 30 and the second opening 302 of the first insulating layer 30, the second opening 302 of the first insulating layer 30 adjacent to the second edge E2 includes a maximum length 302w greater than a maximum length 301w of the first opening 301 of the first insulating layer 30 adjacent to the first edge E1.

In an embodiment, the first insulating layer 30 includes an insulating material having light transparency. For example, the material of the first insulating layer 30 includes $SiO_x$.

In an embodiment of the present application, the first insulating layer 30 includes a thickness between 1000 angstrom (Å) and 20,000 angstrom (ÅA).

In an embodiment of the present application, the material of the first insulating layer 30 includes $SiO_2$, $TiO_2$, or $SiN_x$. If the thickness of the first insulating layer 30 is less than 1000 angstrom (Å), the thinner thickness may make the insulating ability of the first insulating layer 30 weak. As shown in FIG. 2, FIG. 3, FIG. 4, FIG. 17, and FIG. 18, the first insulating layer 30 is formed on the first surface S1 and the second surface S2 after etching. The first insulating layer 30 formed by conformally covering the surface has a specific slope. If the first insulating layer 30 including a thickness less than 1000 angstrom (Å), it may cause cracking of the film.

In an embodiment of the present application, the material of the first insulating layer 30 includes $SiO_2$, $TiO_2$, or $SiN_x$. If the thickness of the first insulating layer 30 is thicker than 20000 angstrom (Å), it is getting difficult to perform selectively etching on the first insulating layer 30. Nevertheless, the above embodiments do not exclude other materials having a good extensibility material or a high etch selectivity to avoid the problem caused by the thin thickness or the thick thickness of the first insulating layer 30.

As shown in FIG. 3, FIG. 3A, FIG. 4, FIG. 5, FIG. 17, and FIG. 18, the first insulating layer 30 includes a side surface which is an inclined surface with respect to a horizontally extending surface of the inner surface 200s or the outer surface 204s of the first semiconductor layer 201 exposed through the selective etching. The inclined surface includes an angle ranged between 10 and 70 degrees with respect to the horizontally extending surface of the inner surface 200s or the outer surface 204s of the first semiconductor layer 201 exposed through the selective etching.

If the angle of the side surface of the first insulating layer 30 is less than 10 degrees, the thickness of the first insulating layer 30 will substantially be reduced. Therefore, it may be difficult to ensure the insulation properties thereof.

If the angle of the side surface of the first insulating layer 30 is greater than 70 degrees, the insulating layer and the metal layer subsequently formed may not completely cover the side surface, thereby causing the film cracking thereof.

In an embodiment of the present application, the side surface of the first insulating layer 30 has an angle between 20 and 75 degrees, preferably between 30 and 65 degrees, more preferably between 40 and 55 degrees.

As shown in FIG. 3, FIG. 3A, FIG. 4, FIG. 5, FIG. 17, and FIG. 18, a contact electrode 40 is formed on the second semiconductor layer 202. Specifically, the contact electrode 40 is formed in the third opening 303 of the first insulating layer 30. The contact electrode 40 includes a transparent electrode. The material of the transparent electrode includes a transparent conductive oxide or a transparent thin metal. The transparent conductive oxide includes indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO) or gallium zinc oxide (GZO). The transparent conductive oxide includes various dopants such as aluminum doped zinc oxide (AZO) or fluorine doped tin oxide (FTO). The transparent thin metal includes nickel (Ni) or gold (Au).

The thickness of the contact electrode 40 is not limited, but may have a thickness between 0.1 nm and 1000 nm. In an embodiment, the material of the contact electrode 40 includes a light-transmitting conductive oxide. If the thickness of the contact electrode 40 is less than 0.1 nm, the thickness of the contact electrode 40 is too thin and not able to form an ohmic contact with the second semiconductor layer 202. If the thickness of the contact electrode 40 is larger than 1000 nm, the contact electrode 40 having the thick thickness may partially absorb the light emitted from the active layer 203, and the luminance of the light-emitting device 1 is reduced. Since the contact electrode 40 has a thickness range described above, the current can be uniformly spread in the horizontal direction to improve the electrical performance of the light-emitting device 1. However, the above embodiments do not exclude other materials being capable of providing lateral current spreading.

As shown in FIG. 2, FIG. 3, FIG. 3A, FIG. 17, and FIG. 18, the contact electrode 40 is substantially formed on the entire surface of the second semiconductor layer 202, and forms a low-resistance contact with the second semiconductor layer 202, such as an ohmic contact. The electrical current is uniformly spread through the second semiconductor layer 202 by the contact electrode 40. In an embodiment, in the cross-sectional view of the light-emitting device 1, the contact electrode 40 includes an outermost side which is separated from the second surface S2 of the recess 204 by a horizontal distance less than 20 μm, preferably less than 10 μm and more preferably less than 5 μm.

As shown in FIG. 2, FIG. 3, FIG. 3A, FIG. 17, and FIG. 18, a reflective layer 50 is formed on the contact electrode 40. The material of the reflective layer 50 includes a metal such as aluminum (Al), silver (Ag), rhodium (Rh), platinum (Pt) or an alloy of the above materials. The reflective layer 50 reflects the light, and the reflected light is emitted outward and toward the substrate 10, wherein the light is formed in the active layer 203.

In another embodiment, the step of forming the contact electrode 40 may be omitted. The reflective layer 50 is formed in the third opening 303 of the first insulating layer 30, and the reflective layer 50 forms an ohmic contact with the second semiconductor layer 202.

In an embodiment, in the cross-sectional view of the light-emitting device, as shown in FIG. 3, FIG. 3A, FIG. 4, FIG. 5, FIG. 17, and FIG. 18, the reflective layer 50 includes an outermost side that is separated from the second surface S2 of the recess 204 by a horizontal distance less than 20 μm, preferably less than 10 μm, more preferably less than 5 μm.

In an embodiment, the reflective layer 50 can be a structure including one or more sub-layers, such as a Distributed Bragg reflector.

In one embodiment, a side surface of the reflective layer 50 is an inclined surface with respect to the top surface of the second semiconductor layer 202, and the inclined surface includes an angle between 10 and 60 degrees with respect to the top surface of the second semiconductor layer 202. The material of the reflective layer 50 can be silver (Ag). If the angle of the reflective layer 50 is less than 10 degrees, a gentle slope can lower the reflection efficiency of the light. In addition, an angle less than 10 degrees is also difficult to achieve a uniform thickness. If the angle of the reflective layer 50 is greater than 60 degrees, it may cause cracking of the film subsequently formed. However, the above embodiments do not exclude other materials having high reflectance.

The adjustment of the angle of the reflective layer 50 can be achieved by changing the configuration of the substrate and the deposition direction of the metal atoms in the thermal deposition process. For example, the position of the substrate is adjusted such that the surface of the substrate is an inclined surface with respect to the deposition direction in the evaporation or the sputtering.

In an embodiment, a barrier layer (not shown) is formed on the reflective layer 50 to cover the top surface and the side surface of the reflective layer 40 to avoid the surface oxidation of the reflective layer 50 which deteriorated the reflectance of the reflective layer 50. The material of the barrier layer includes a metal such as titanium (Ti), tungsten (W), aluminum (Al), indium (In), tin (Sn), nickel (Ni), chromium (Cr), platinum (Pt) or an alloy of the above materials. The barrier layer includes one or more layers, such as titanium (Ti)/aluminum (Al), and/or nickel titanium alloy (NiTi)/titanium tungsten alloy (TiW). In an embodiment of the present application, the barrier layer includes a laminated structure including titanium (Ti)/aluminum (Al) and a laminated structure including nickel titanium alloy (NiTi)/titanium tungsten alloy (TiW), wherein laminated structure including titanium (Ti)/aluminum (Al) is formed on one side away from the reflective layer 50, and the laminated structure including nickel titanium alloy (NiTi)/titanium tungsten alloy (TiW) is adjacent to one side adjacent to the reflective layer 50. In an embodiment of the application, the material of the reflective layer 50 and the barrier layer preferably includes a metal material other than gold (Au) or copper (Cu).

The laminated structure of the barrier layer includes nickel titanium alloy (NiTi)/titanium tungsten alloy (TiW)/platinum (Pt)/titanium (Ti)/aluminum (Al)/titanium (Ti)/aluminum (Al)/Chromium (Cr)/platinum (Pt), the barrier layer includes an angle between 10 and 60 degrees with respect to the surface of the second semiconductor layer 203. In an embodiment, if the angle of the barrier layer is less than 10 degrees, the barrier layer cannot completely cover the reflective layer 50 and is also difficult to achieve a uniform thickness. If the angle of the barrier layer is greater than 60 degrees, it may cause cracking of the film subsequently formed.

In an embodiment, the thickness of the reflective layer 50 or the barrier layer is preferably between 100 nm and 1 μm. If the thickness of the reflective layer 50 or the barrier layer is less than 100 nm, the light emitted from the active layer 202 cannot be effectively reflected. If the thickness of the reflective layer 50 or the barrier layer is larger than 1 μm, the manufacturing loss is caused by excessive production time.

In order to cover the top surface and the side surface of the reflective layer 50, the barrier layer includes a bottom surface contacting with the second semiconductor layer 202 and/or the contact electrode 40.

As shown in FIG. 2, FIG. 3, FIG. 3A, FIG. 4, FIG. 17, and FIG. 18, a second insulating layer 60 is formed on the semiconductor stack 20, and an opening 600 of the second insulating layer 60 is formed in the via 200 by a selectively etching to expose the first semiconductor layer 201 on the via 200. A plurality of first openings 601 of the second insulating layer 60 is formed on the recess 204 adjacent to the first edge E1 to expose the first semiconductor layer 201 on the recess 204. A plurality of second openings 602 of the second insulating layer 60 is formed on the recess 204 adjacent to the second edge E2 to expose the substrate 10 and the first semiconductor layer 201 on the recess 204. A third opening 603 of the second insulating layer 60 is formed on the second semiconductor layer 202 to expose portions of the second semiconductor layer 202, the reflective layer 50, and/or the barrier layer. The remaining area is shielded by the second insulating layer 60.

As shown in FIG. 1 and FIG. 2, in order to provide same areas of the first semiconductor layer 201 exposed by the first opening 601 of the second insulating layer 60 and the second opening 602 of the second insulating layer 60, the second opening 602 of the second insulating layer 60 adjacent to the second edge E2 includes a maximum length 602w greater than a maximum length 601w of the first opening 601 of the second insulating layer 60 adjacent to the first edge E1.

In an embodiment, the second insulating layer 60 includes an insulating material having light transparency. For example, the second insulating layer 60 includes SiO$_x$.

In an embodiment of the present application, the second insulating layer 60 includes a thickness between 1000 angstrom (Å) and 60,000 angstrom (Å).

In an embodiment of the present application, the material of the second insulating layer 60 includes SiO$_2$, TiO$_2$, or SiN$_x$. If the thickness of the second insulating layer 60 is less than 1000 angstrom (Å), the thinner thickness may make the insulating property of the second insulating layer 60 weak. Specifically, the second insulating layer 60 is conformally formed on the etched first surface S1 and the etched second surface S2, and the second insulating layer 60 includes an inclined surface, if the second insulating layer 60 includes a thickness less than 1000 angstrom (Å), it may cause cracking of the film.

In an embodiment of the present application, the material of the second insulating layer 60 includes SiO$_2$, TiO$_2$, or SiN$_x$. If the thickness of the second insulating layer 60 is thicker than 60000 angstrom (Å), it is difficult to perform the selective etching on the second insulating layer 60. Nevertheless, the above embodiments do not exclude other materials having a good extensibility material or a high etch selectivity to avoid the problem caused by the thin thickness or the thick thickness of the second insulating layer 60.

As shown in FIG. 3, FIG. 3A, FIG. 4, FIG. 5, FIG. 17, and FIG. 18, the second insulating layer 60 includes a side surface which is an inclined surface with respect to a horizontally extending surface of the inner surface 200s or the outer surface 204s of the first semiconductor layer 201 exposed through the selectively etching. The inclined surface includes an angle between 10 and 70 degrees with respect to the horizontally extending surface of the inner surface 200s or the outer surface 204s of the first semiconductor layer 201 exposed through the selectively etching.

If the angle of the side surface of the first insulating layer 60 is less than 10 degrees, the thickness of the second insulating layer 60 will be substantially reduced. Therefore, it may be difficult to ensure the insulation properties thereof.

If the angle of the side surface of the second insulating layer 60 is greater than 70 degrees, the insulating layer and the metal layer subsequently formed may not completely cover the second insulating layer 60, thereby causing the film cracking of the insulating layer and the metal layer.

In an embodiment of the present application, the side surface of the second insulating layer 60 has an angle between 20 and 75 degrees, preferably between 30 and 65 degrees, more preferably between 40 and 55 degrees.

The opening 600 of the second insulating layer 60, the first opening 601 of the second insulating layer 60, the second opening 602 of the second insulating layer 60, and the third opening 603 of the second insulating layer 60 are formed at positions respectively corresponding to those of the opening 300 of the first insulating layer 30, the first opening 301 of the first insulating layer 30, the second opening 302 of the first insulating layer 30, and the third opening 303 of the first insulating layer 30.

As shown in FIG. 2, FIG. 3, FIG. 3A, FIG. 4, FIG. 17, and FIG. 18, the bottom electrode 71 is formed on the second insulating layer 60, extends into the one or the plurality of openings 600 of the second insulating layer 60, directly contacts the first semiconductor layer 201 in the via 200, and is electrically connected to the first semiconductor layer 201 of the light-emitting device 1. The bottom electrode 71 extends from the semiconductor mesa 205 along the first surface S1 to cover the first semiconductor layer 201 on the via 200. As shown in FIGS. 4, 5, the bottom electrode 71 extends from the semiconductor mesa 205, covers the first opening 601 of the second insulating layer 60 formed adjacent to the first edge E1 and the second opening 602 of the second insulating layer 60 formed adjacent to the second edge E2, and directly contacts the first semiconductor layer 201 located on the recess 204 so that the electrical current is uniformly diffused on the outer periphery of the light-emitting device 1.

As shown in FIG. 1, FIG. 2, FIG. 4 and FIG. 16, a plurality of concave parts 2050 and a plurality of convex parts 2051 are alternately arranged with each other. The concave part 2050 between two discontinuous convex parts 2051 exposes the first semiconductor layer 201. The bottom electrode 71 covers the plurality of convex parts 2051, extends along the second surface S2 to cover the outer surface 204s of the first semiconductor layer 201 exposed on the recess 204.

In order to uniformly spread the electrical current at the outer periphery of the light-emitting device 1, as shown in FIG. 1, FIG. 2, and FIG. 4, the plurality of first openings 601 of the second insulating layer 60 is provided at a regular interval. A fifth distance d1 between the adjacent two of the first openings 601 of the second insulating layer 60 may be greater than n times the width w1 of the first opening 601 of the second insulating layer 60, d1=(1+n)w1, wherein n may be an integer or not an integer. For example, it is more than 0.5 times, preferably more than one times, more preferably more than twice.

As shown in FIG. 5, the plurality of second openings 602 of the second insulating layer 60 discontinuously exposes the outer surface 204s of the first semiconductor layer 201. The bottom electrode 71 covers the first insulating layer 30 and the second insulating layer 60, and is electrically connected to the first semiconductor layer 201 through the plurality of second openings 602 of the first insulating layer 30 and the plurality of second openings 602 of the second insulating layer 60.

In order to uniformly spread the electrical current at the outer periphery of the light-emitting device 1, as shown in FIG. 4, the plurality of second openings 602 of the second insulating layer 60 is disposed at a regular interval. The sixth distance d2 between the adjacent two of the second openings 602 of the second insulating layer 60 may be greater than n times the width w2 of the second opening 602 of the second insulating layer 60, d2=(1+n)w2, wherein n may be an integer or not an integer. For example, it is more than 0.5 times, preferably more than one times, more preferably more than twice.

As shown in FIG. 1, in order to uniformly spread the electrical current at the outer periphery of the light-emitting device 1, in an embodiment of the present application, the fifth distance d1 between the adjacent two first openings 601 of the second insulating layer 60 formed adjacent to the first edge E1 is substantially the same as the sixth distance d2 between the adjacent two second openings 602 of the second insulating layer 60 formed adjacent to the second edge E2.

As shown in FIG. 1, in order to uniformly spread the electrical current at the outer periphery of the light-emitting device 1, in an embodiment of the present application, the width w1 of the first opening 601 of the second insulating layer 60 adjacent to the first edge E1 is substantially the same as the width w2 of the second opening 602 of the second insulating layer 60 adjacent to the second edge E2.

As shown in FIG. 3 and FIG. 3A, the top electrode 72 is formed in the third opening 603 of the second insulating layer 60. The top electrode 72 contacts the second semiconductor layer 202 and electrically connected to the second semiconductor layer 202 and the reflective layer 50. The second insulating layer 60 is located between the bottom electrode 71 and the top electrode 72 to prevent the bottom electrode 71 and the top electrode 72 from contacting each other to form a short circuit.

As shown in FIGS. 1 and 2, in the top view of the light-emitting device 1, the top electrode 72 includes an area smaller than that of the bottom electrode 71, and the top electrode 72 is surrounded by the bottom electrode 71.

The bottom electrode 71 and the top electrode 72 include a metal material including chromium (Cr), titanium (Ti), tungsten (W), gold (Au), aluminum (Al), indium (In), tin (Sn), nickel (Ni), platinum (Pt) or an alloy of the above materials. The bottom electrode 71 and the top electrode 72 include single layer or multilayers. For example, the bottom electrode 71 or the top electrode 72 includes Ti/Au stack, Ti/Pt/Au stack, Cr/Au stack, Cr/Pt/Au stack, Ni/Au stack, Ni/Pt/Au stack or Cr/Al/Cr/Ni/Au stack.

The bottom electrode 71 or the top electrode 72 includes a thickness preferably between 0.5 μm and 3.5 μm.

In an embodiment, as shown in FIG. 3, FIG. 3A, FIG. 17, and FIG. 18, the top electrode 72 includes a top surface 72s that is lower than a top surface 71s of the bottom electrode 71. In other words, a step height is formed between the top surface 72s of the top electrode 72 and the top surface 71s of the bottom electrode 71, wherein the step height is between 2000 angstrom (Å) and 60,000 angstrom (Å).

In an embodiment, a step height between the top surface 72s of the top electrode 72 and the top surface 71s of bottom electrode 71 is substantially same as the thickness of the second insulating layer 60.

In an embodiment, a step height between the top surface 72s of the top electrode 72 and the top surface 71s of bottom electrode 71 has a deviation of ±30% from the thickness of the second insulating layer 60.

In an embodiment, as shown in FIG. 3, FIG. 3A, FIG. 17, and FIG. 18, a step height between the top surface 71s of the bottom electrode 71 and the top surface 72s of the top electrode 72 is smaller than 2000 angstrom (Å), preferably smaller than 1000 angstrom (Å), and more preferably smaller than 500 angstrom (Å).

In an embodiment (not shown), a metal pad is formed below the bottom electrode, and the thickness of the metal pad has a deviation of ±30% from the thickness of the second insulating layer 60, so that the top surface 71s of the bottom electrode 71 and the top surface 72s of the top electrode 72 are substantially flush.

As shown in FIG. 2, FIG. 3, FIG. 3A, FIG. 17, and FIG. 18, a third insulating layer 80 is formed on the semiconductor stack 20. A first opening 801 of the third insulating layer 80 is formed on the bottom electrode 71 by the selective etching to expose a portion of the top surface 71s of the bottom electrode 71. A second opening 802 of the third insulating layer 80 is formed on the top electrode 72 to expose the top surface 72s of the top electrode 72.

The third insulating layer 80 includes an insulating material having light transparency. For example, the third insulating layer 80 includes $SiO_x$.

The first insulating layer 30, the second insulating layer 60, or the third insulating layer 80 includes two or more materials having different refractive indices alternately stacked to form a Distributed Bragg Reflector (DBR). In an embodiment, the first insulating layer 30, the second insulating layer 60, or the third insulating layer 80 is laminated with sub-layers of $SiO_2/TiO_2$ or $SiO_2/Nb_2O_5$ to selectively reflect the light of a specific wavelength, thereby increasing the light extraction efficiency of the light-emitting device 1. When the peak emission wavelength of the light-emitting device 1 is λ, the optical thickness of the first insulating layer 30, the second insulating layer 60, or the third insulating layer 80 can be an integral multiple of λ/4. The peak emission wavelength refers to the wavelength having a strongest intensity in the emission spectrum of the light-emitting device 1. The thickness of the first insulating layer 30, the second insulating layer 60, or the third insulating layer 80 may have a deviation of ±30% on the basis of an integral multiple of the optical thickness λ/4.

The first insulating layer 30, the second insulating layer 60, or the third insulating layer 80 includes a non-conductive material including organic material, inorganic material or dielectric material. The organic material includes Sub, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$).

In an embodiment, the material of the third insulating layer 80 includes $SiO_2$, $TiO_2$, or $SiN_x$. The thickness of the third insulating layer 80 is between 10000 angstrom (Å) and 60000 angstrom (Å). If the thickness of the third insulating layer 80 is less than 10000 angstrom (Å), the thinner thickness may weaken the insulating ability and moisture resistance of the third insulating layer 80. In another embodiment, the material of the third insulating layer 80 includes $SiO_2$, $TiO_2$, or $SiN_x$. When the thickness of the third insulating layer 80 is thicker than 60000 angstrom (Å), it is difficult to perform the selective etching on the third insulating layer 80. Nevertheless, the above embodiments do not exclude other materials having a good extensibility material or having a high etch selectivity to avoid the problem caused by the excessively thin or excessively thick film of the third insulating layer 80.

As shown in FIG. 1, FIG. 3, FIG. 3A, FIG. 17, and FIG. 18, the light-emitting device 1 includes a first electrode pad 91 covering the first opening 801 of the third insulating layer 80 and contacting the bottom electrode 71. The first electrode pad 91 is electrically connected to the first semiconductor layer 201 through the bottom electrode 71. The light-emitting device 1 includes a second electrode pad 92 covering the second opening 802 of the third insulating layer 80 and contacting the top electrode 72 to form an electrical connection with the reflective layer 50, the contact electrode 40, and the second semiconductor layer 202.

In an embodiment, as shown in FIG. 3, the first sidewall 2011 of the first semiconductor layer 201 near the fourth edge E4 is not covered by the third insulating layer 80 and is exposed. The second side wall 2012 of the first semiconductor layer 201 near the second edge E2 is covered by the third insulating layer 80.

In an embodiment, as shown in FIG. 3A, the first sidewall 2011 of the first semiconductor layer 201 near the first edge E1 is covered by the third insulating layer 80, and the second side wall 2012 of the first semiconductor layer 201 near the second edge E2 is covered by the third insulating layer 80.

In an embodiment, as shown in FIG. 3A, the third insulating layer 80 includes a first side surface of a third insulating layer and a second side surface of a third insulating layer. The first side surface of the third insulating layer is directly connected to the first side surface 101 of the substrate 10.

In an embodiment (not shown), the first side surface of the third insulating layer 80 is directly connected to the first side surface 101 of the substrate 10. In the cross-sectional view of the light-emitting device, the second side surface of the third insulating layer is located between the second side surface 102 of the substrate 10 and the second sidewall 2012 of the first semiconductor layer 201, and spaced apart from the second side surface 102 of the substrate 10 to expose the substrate 10.

In the top view of the light-emitting device 1, as shown in FIG. 1, the first electrode pad 91 includes a top surface area smaller than a top surface area of the bottom electrode 71. The second electrode pad 92 includes a top surface area that is smaller than a top surface area of the top electrode 72.

The first electrode pad 91 and the second electrode pad 92 include a metal material including chromium (Cr), titanium (Ti), tungsten (W), gold (Au), aluminum (Al), indium (In), tin (Sn), nickel (Ni), platinum (Pt) or an alloy of the above materials. The first electrode pad 91 and the second electrode pad 92 include single layer or multilayers. For example, the first electrode pad 91 or the second electrode pad 92 includes Ti/Au stack, Ti/Pt/Au stack, Cr/Au stack, Cr/Pt/Au stack, Ni/Au stack, Ni/Pt/Au stack, or Cr/Al/Cr/Ni/Au stack.

In an embodiment of the present application, the first electrode pad 91 includes a size that is the same as or different from a size of the second electrode pad 92. The size includes a width or an area. For example, a top area of the first electrode pad 91 or the second electrode pad 92 may be 0.8 times or more of the top areas of the first electrode pad 91 and the second electrode pad 92, and be less than one time a sum of the top areas of the first electrode pad 91 and the second electrode pad 92.

The first electrode pad 91 or the second electrode pad 92 respectively includes an inclined side surface, and the cross-sectional area of the first electrode pad 91 or the second electrode pad 92 varies along the thickness direction. For example, the cross-sectional area of the first electrode pad 91 or the second electrode pad 92 gradually diminishes away from the upper surface of the semiconductor stack 20.

The first electrode pad 91 or the second electrode pad 92 includes a thickness between 1 and 100 µm, preferably between 1.5 and 6 µm.

A space is between the first electrode pad 91 and the second electrode pad 92, and the space is ranged from 10 µm to 250 µm. In the distance range described above, the top areas of the first electrode pad 91 and the second electrode pad 92 can be increased by reducing the distance of the space between the first electrode pad 91 and the second electrode pad 92. The heat dissipation efficiency of the light-emitting device 1 can be improved, and a short circuit between the first electrode pad 91 and the second electrode pad 92 can also be avoided.

Figure 6A:
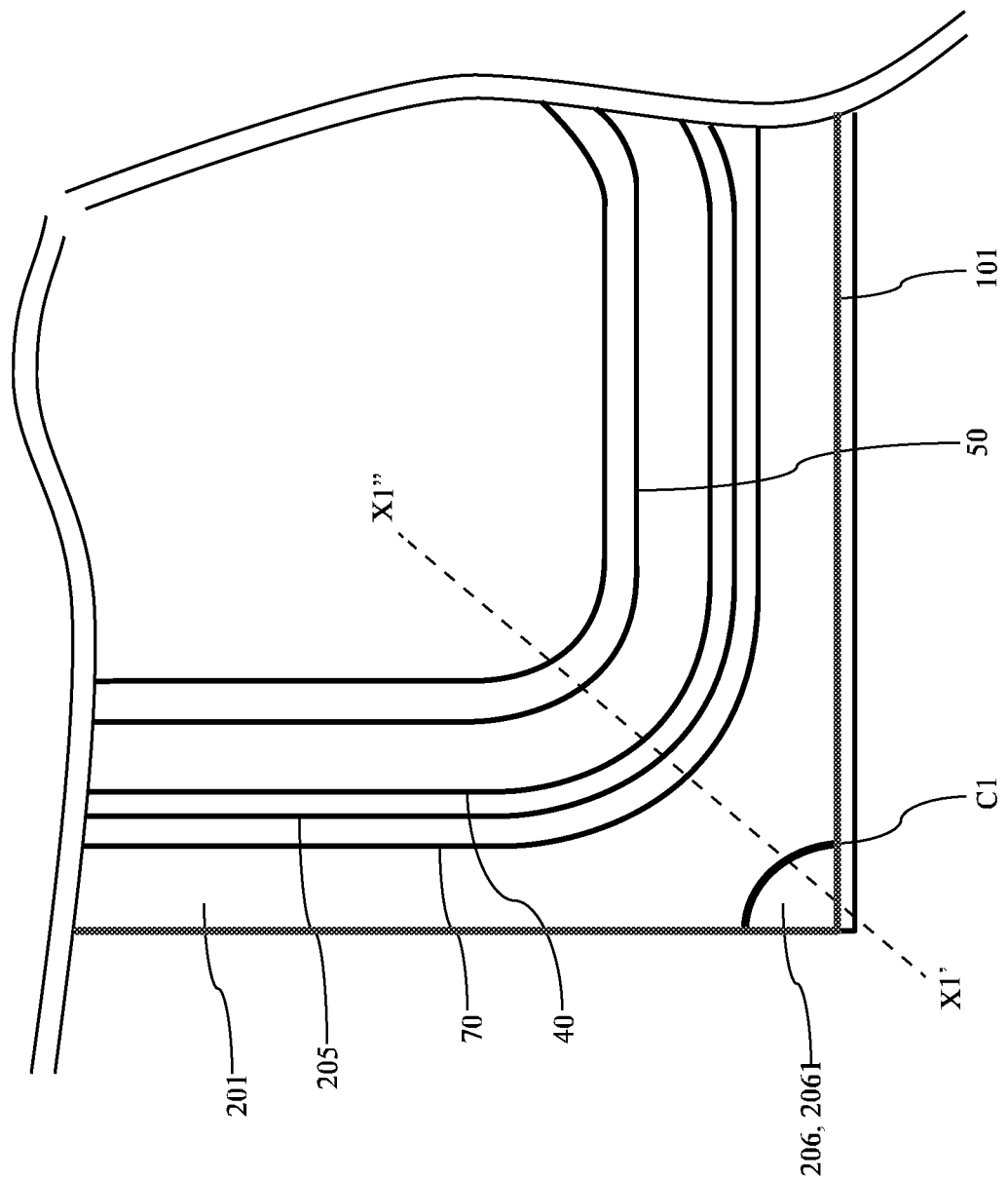
FIG. 6A is a partially enlarged top view of a portion X1 shown in FIG. 1.
Figure 6C:
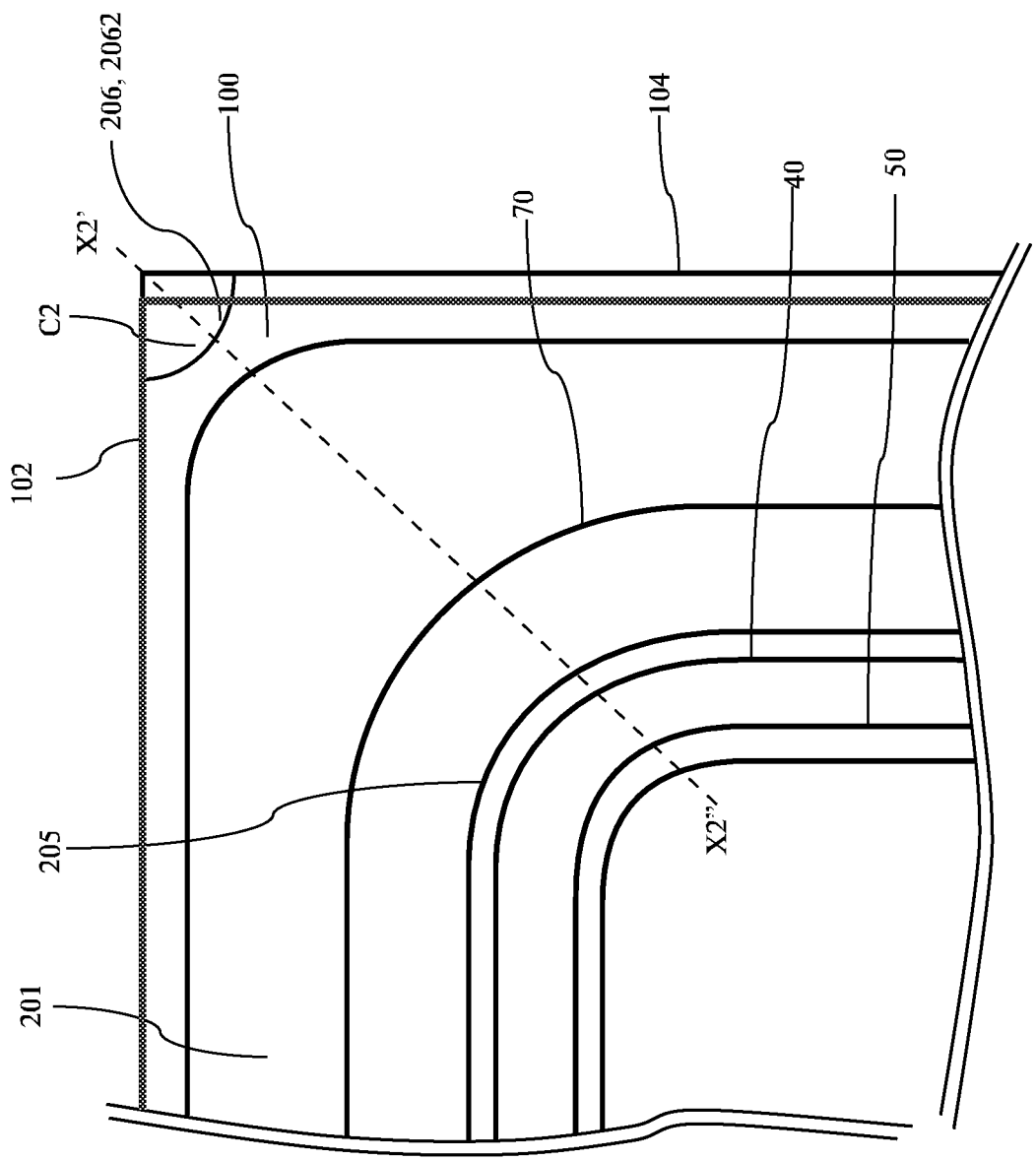
FIG. 6C is a partially enlarged top view of a portion X2 shown in FIG. 1.
Figure 6D:
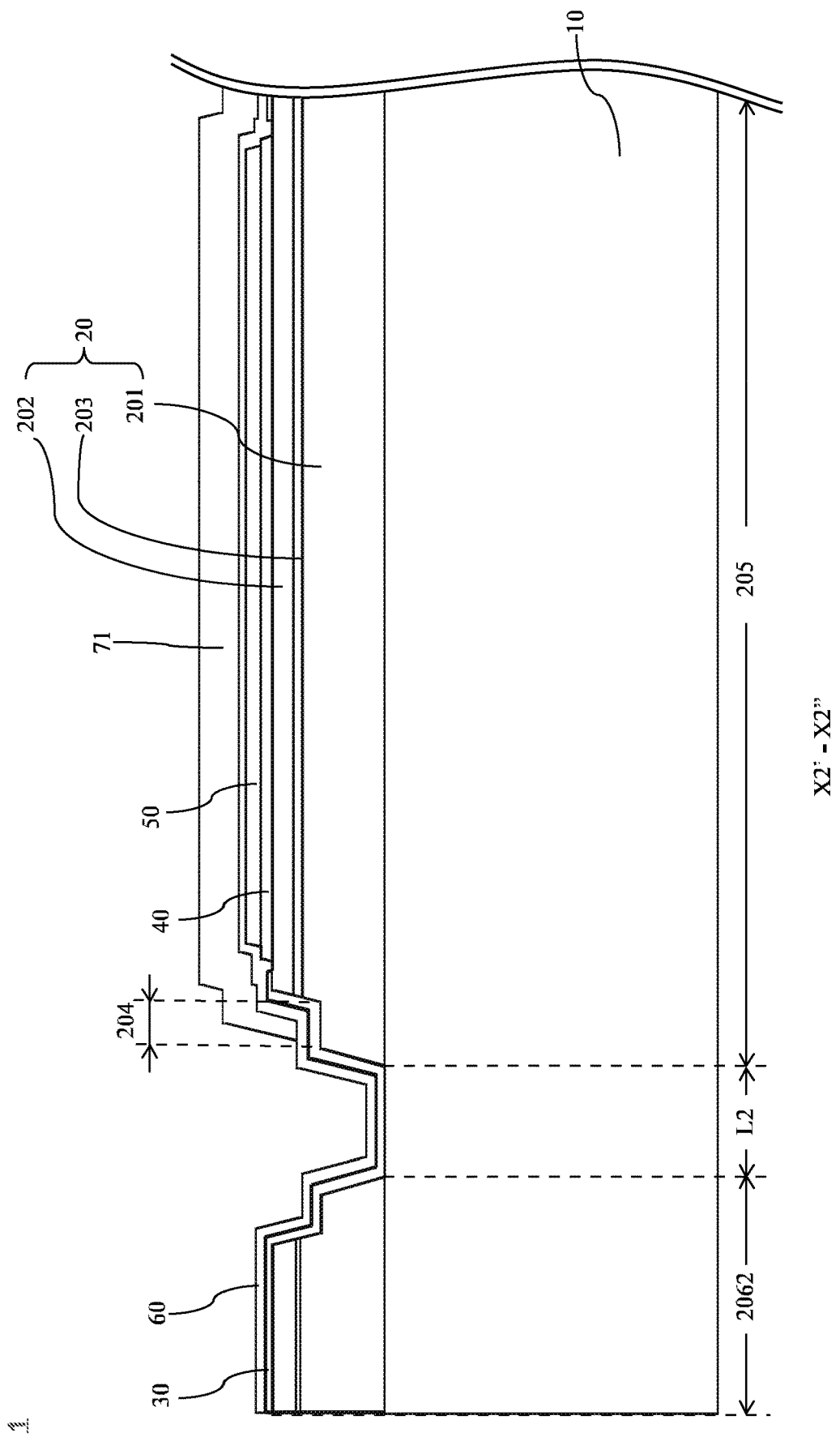
FIG. 6D illustrates a cross-sectional view taken along line X2'-X2" of FIG. 6C.

FIG. 6A is a partially enlarged top view of a portion X1 of FIG. 1. FIG. 6B illustrates a cross-sectional view taken along line X1'-X1" of FIG. 6A. FIG. 6C is a partially enlarged top view of a portion X2 of FIG. 1. FIG. 6D illustrates a cross-sectional view taken along line X2'-X2" of FIG. 6C.

In an embodiment of the present application, as shown in FIG. 1, in the top view of the light-emitting device 1, the light-emitting device 1 includes a plurality of corners, wherein the plurality of corners includes a first corner C1, a second corner C2, a third corner C3, and a fourth corner C4. The light-emitting device 1 includes a plurality of semiconductor structures 206, wherein the plurality of semiconductor structures 206 includes a first semiconductor structure 2061, a second semiconductor structure 2062, a third semiconductor structure 2063, and a fourth semiconductor structure 2064. The first semiconductor structure 2061, the second semiconductor structure 2062, the third semiconductor structure 2063, and the fourth semiconductor structure 2064 are respectively located at the first corner C1, the second corner C2, the third corner C3, and the fourth corner C4.

In another embodiment of the present application (not shown), the light-emitting device 1 includes a plurality of edges, wherein the plurality of edges include a first edge E1, a second edge E2, a third edge E3, and a fourth edge E4. The plurality of semiconductor structures 206 can be respectively located on the plurality of edges.

As shown in FIG. 1 and FIGS. 6A-6D, the plurality of semiconductor structures 206 is respectively separated from the semiconductor mesa 205, and the plurality of semiconductor structures 206 is separated from each other.

As shown in FIG. 1 and FIGS. 6A–6B, the first semiconductor structure 2061 adjacent to the first edge E1 is separated from the semiconductor mesa 205 by a first shortest distance L1. The fourth semiconductor structure 2064 adjacent to the first edge E1 is separated from the semiconductor mesa 205 by a fourth shortest distance L4 (not shown). As shown in FIG. 1, FIG. 6C, and FIG. 6D, the second semiconductor structure 2062 adjacent to the second edge E2 is separated from the semiconductor mesa 205 by a second shortest distance L2. The third semiconductor structure 2063 adjacent to the second edge E2 is separated from the semiconductor mesa 205 by a third shortest distance L3 (not shown)

In an embodiment of the present application, the second shortest distance L2 and the third shortest distance L3 are respectively larger than the first shortest distance L1.

In an embodiment of the present application, the second shortest distance L2 and the third shortest distance L3 are substantially the same.

In an embodiment of the present application, the second shortest distance L2 and the third shortest distance L3 have a deviation of ±30%.

In an embodiment of the present application, the first shortest distance L1 and the fourth shortest distance L4 are different to be an identification point of the light-emitting device 1. The fourth shortest distance L4 is larger than the first shortest distance L1, the second shortest distance L2, and/or the third shortest distance L3, respectively.

As shown in FIG. 6B, the first semiconductor layer 201 adjacent to the first corner C1 is located between the first semiconductor structure 2061 and the semiconductor mesa 205, and the first semiconductor layer 201 connects the first semiconductor structure 2061 and the semiconductor mesa 205. The first semiconductor layer 201 adjacent to the fourth corner C4 is located between the fourth semiconductor structure 2064 and the semiconductor mesa 205, and the first semiconductor layer 201 connects the first semiconductor structure 2061 and the semiconductor mesa 205 (not shown). As shown in FIG. 6D, the first semiconductor layer 201 adjacent to the second corner C2 and formed between the second semiconductor structure 2062 and the semiconductor mesa 205 is removed, the substrate 10 is exposed, and the second semiconductor structure 2062 and the semiconductor mesa 205 are separated from each other. The first semiconductor layer 201 adjacent to the third corner C3 and formed between the third semiconductor structure 2063 and the semiconductor mesa 205 is removed, the substrate 10 is exposed, and the third semiconductor structure 2063 and the semiconductor mesa 205 are separated from each other (not shown).

In an embodiment of the present application, in the top view of the light-emitting device 1, the first semiconductor structure 2061, the second semiconductor structure 2062, the third semiconductor structure 2063, and the fourth semiconductor structure 2064 include a shape such as rectangular, triangular or fan shape.

Figure 7:
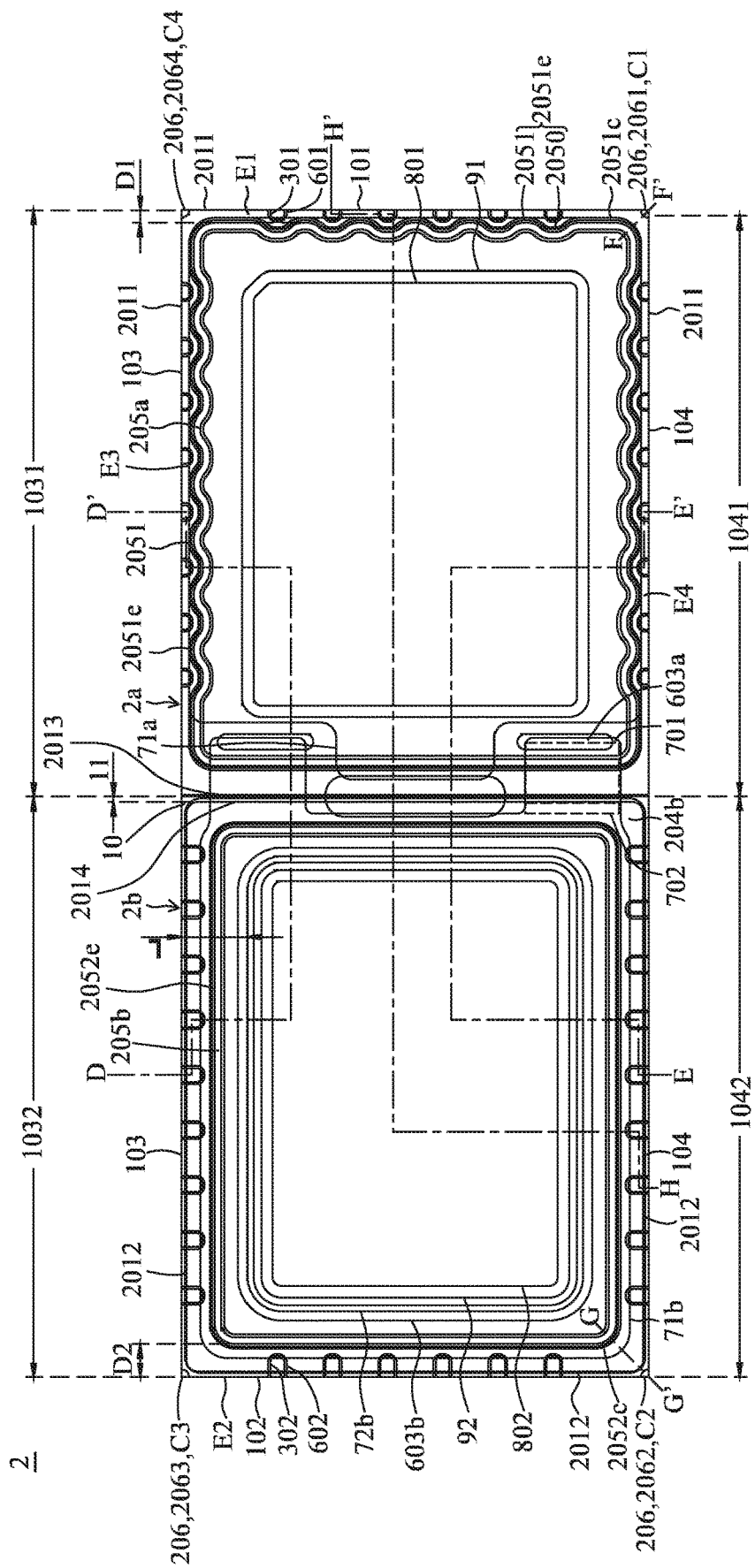
FIG. 7 illustrates a top view of a light-emitting device 2 in accordance with an embodiment of the present application.
Figure 8:
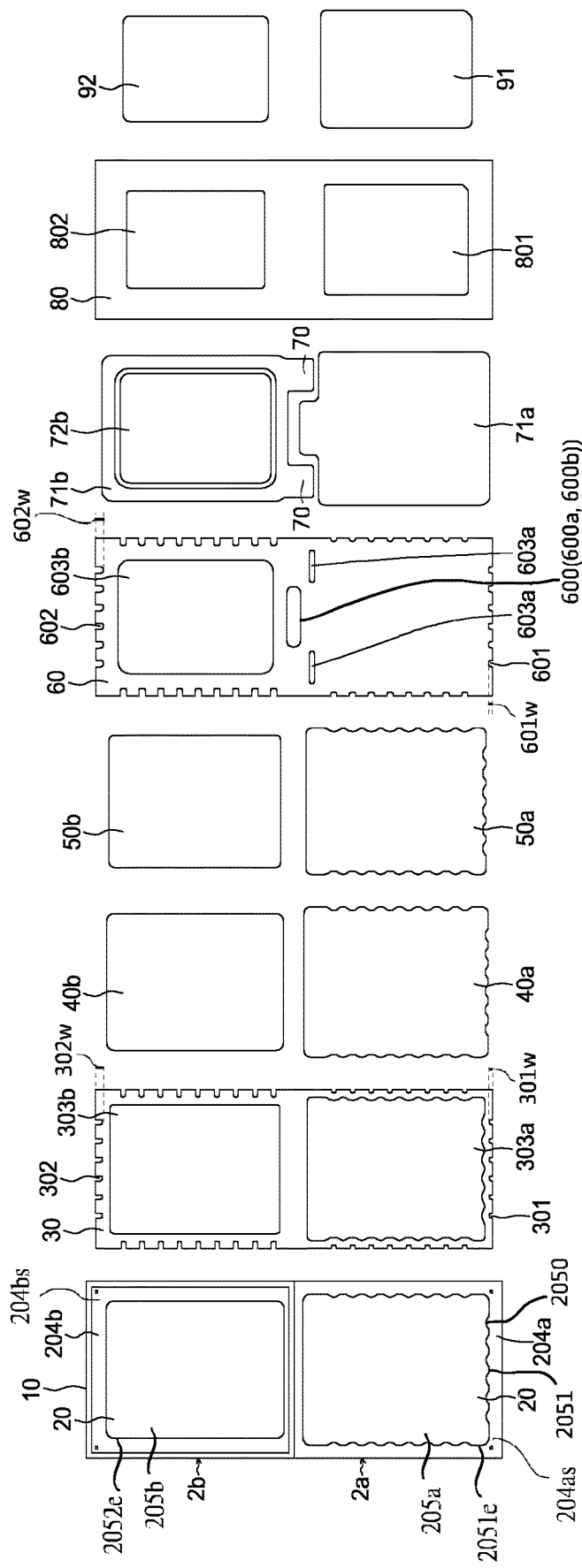
FIG. 8 illustrates a top view pattern of each layer of the light-emitting device 2 in accordance with an embodiment of the present application.
Figure 9:
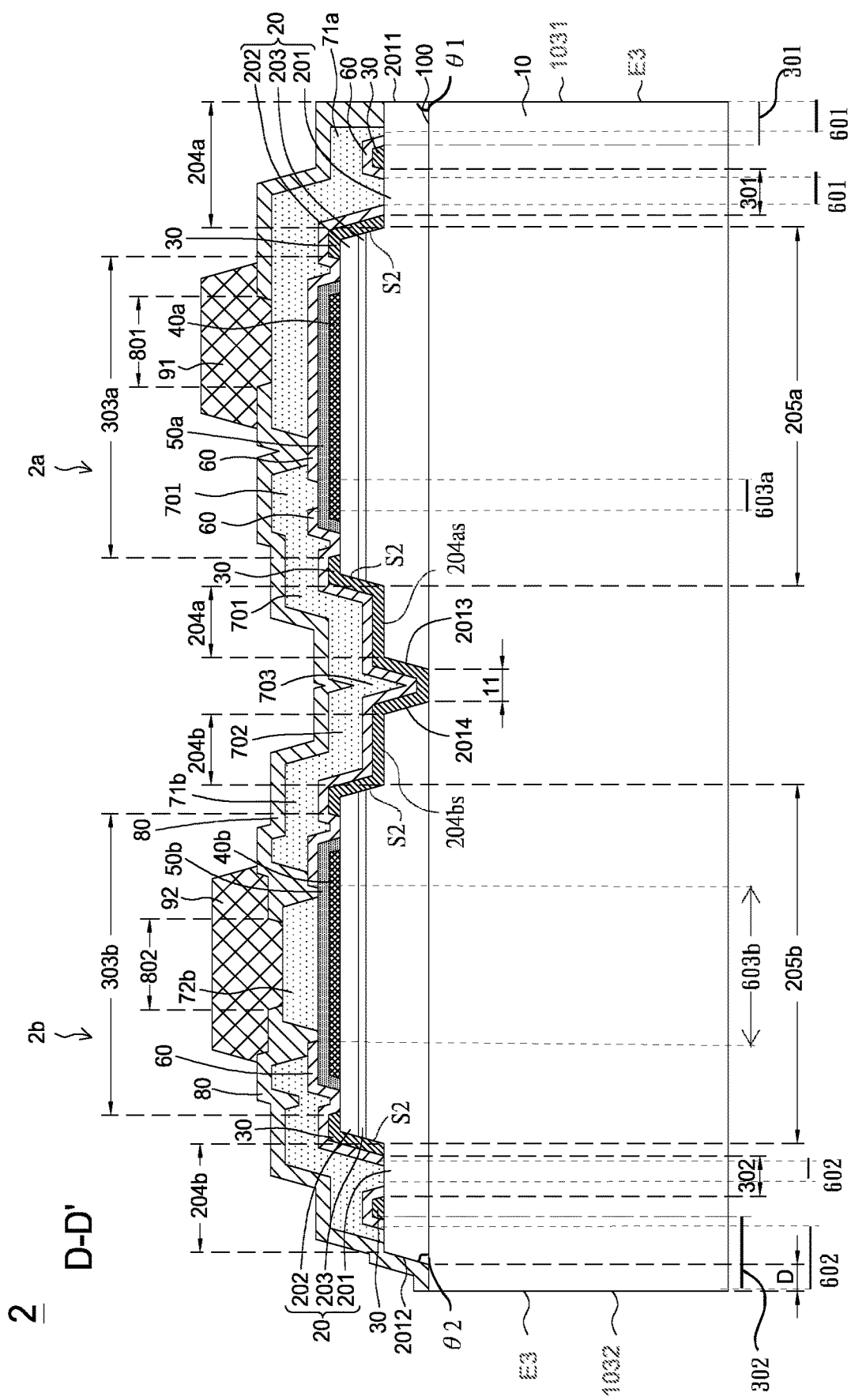
FIG. 9 illustrates a cross-sectional view taken along line D-D' of FIG. 7.
Figure 9A:
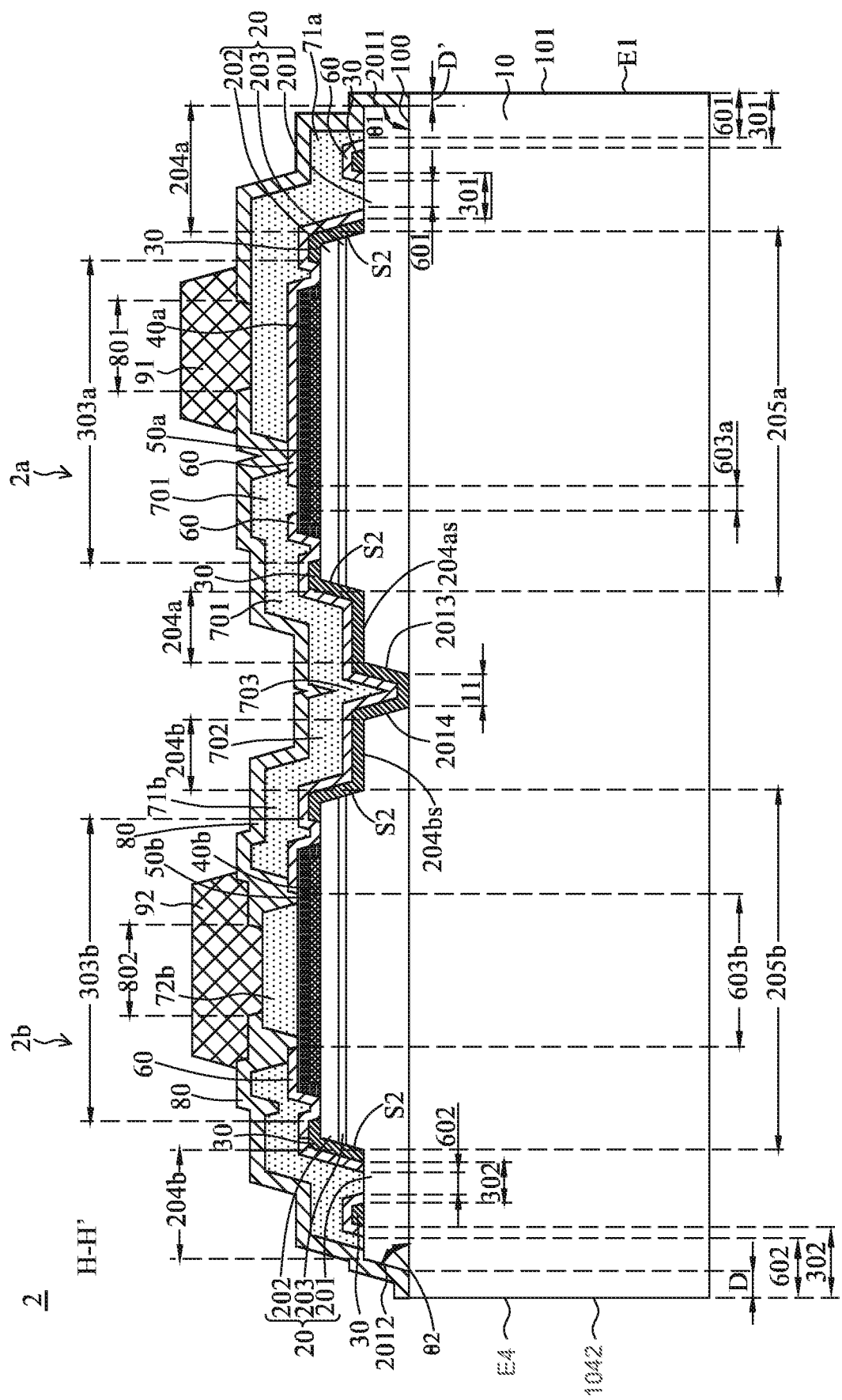
FIG. 9A illustrates a cross-sectional view taken along line H-H' of FIG. 7.
Figure 10:
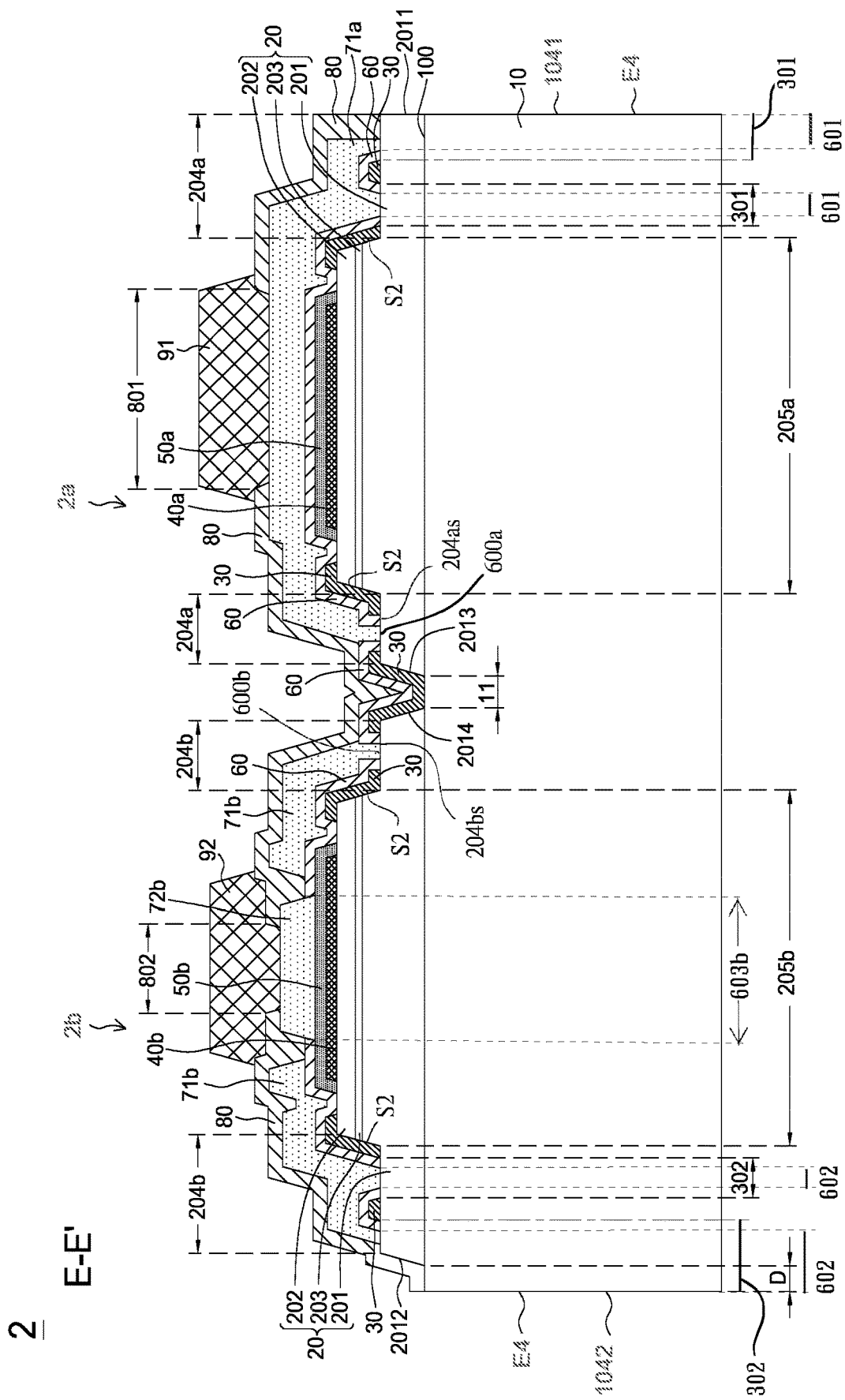
FIG. 10 illustrates a cross-sectional view taken along line E-E' of FIG. 7.
Figure 11:
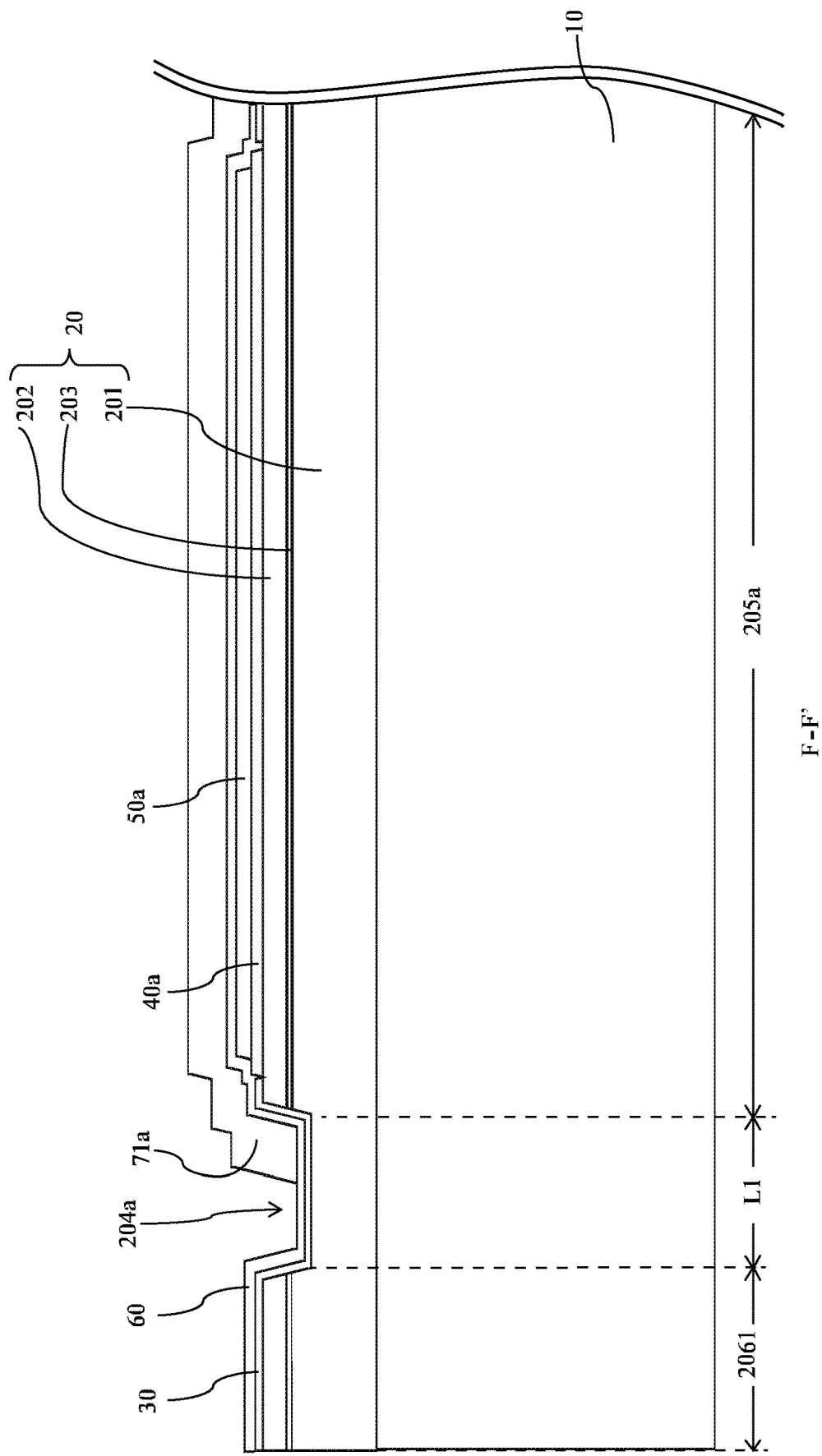
FIG. 11 illustrates a cross-sectional view taken along line F-F' of FIG. 7.
Figure 12:
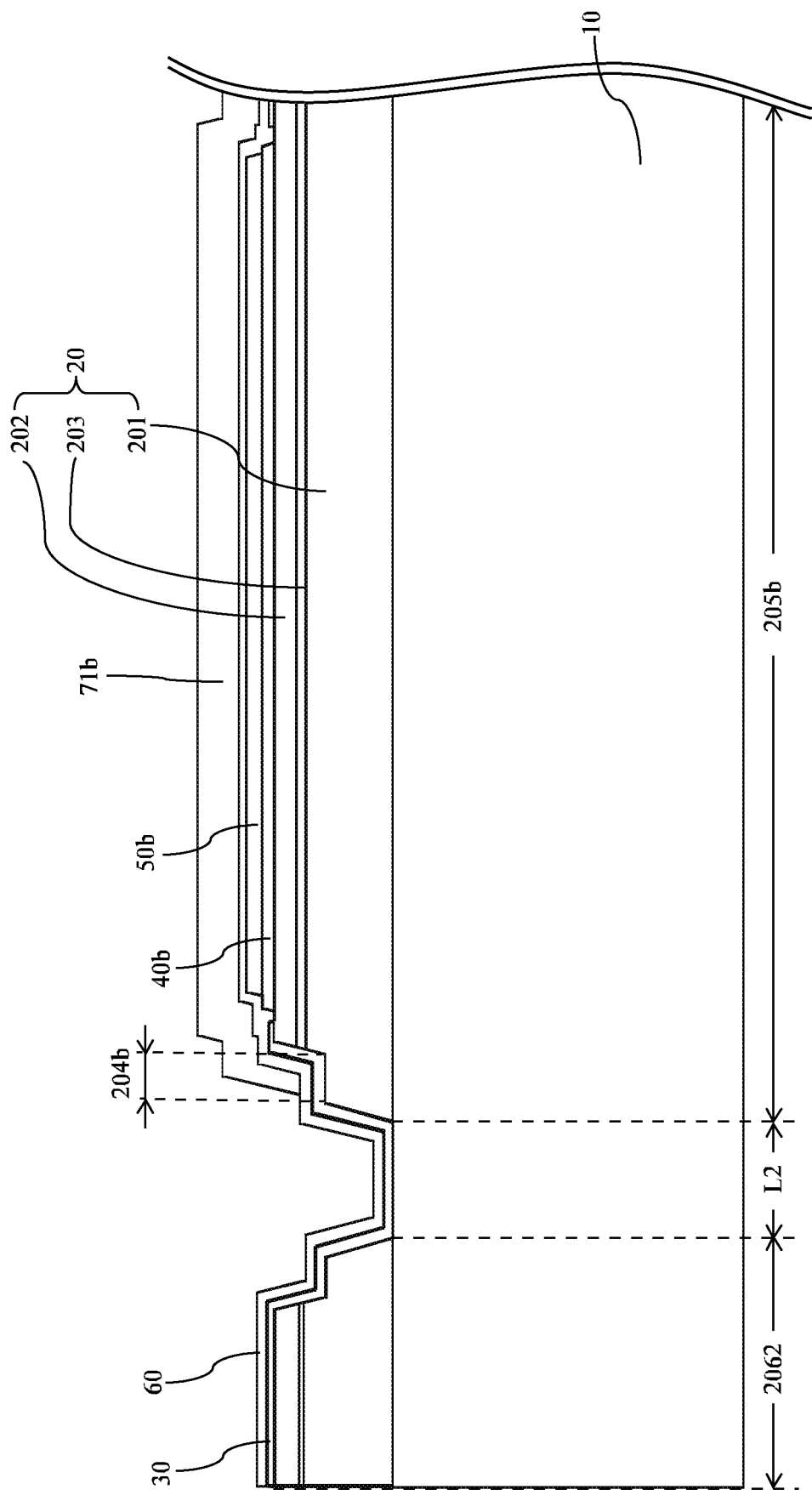
FIG. 12 illustrates a cross-sectional view taken along line G-G' of FIG. 7.

FIG. 7 illustrates a top view of a light-emitting device 2 in accordance with an embodiment of the present application. FIG. 8 illustrates a top view pattern of each layer of the light-emitting device 2 in accordance with an embodiment of the present application. FIG. 9 illustrates a cross-sectional view taken along line D-D' of FIG. 7. FIG. 9A illustrates a cross-sectional view taken along line H-H' of FIG. 7. FIG. 10 illustrates a cross-sectional view taken along line E-E' of FIG. 7. FIG. 11 illustrates a cross-sectional view taken along line F-F' of FIG. 7. FIG. 12 illustrates a cross-sectional view taken along line G-G' of FIG. 7. The light-emitting device 2 illustrated in FIGS. 7-12 and the light-emitting device 1 illustrated in FIGS. 1~6D substantially includes the same structure with the same designations and numbers, the same material, or the same function, and the related descriptions will be properly omitted in the following paragraphs.

As shown in FIG. 7, FIG. 8, FIG. 9, FIG. 9A, and FIG. 10, the light-emitting device 2 includes a substrate 10; and a first light-emitting element 2a and a second light-emitting element 2b formed on the substrate 10, wherein the first light-emitting element 2a and the second light-emitting element 2b are separated by a trench 11, and the trench 11 exposes the top surface 100 of the substrate 10.

As shown in FIG. 7, FIG. 8, FIG. 9, FIG. 9A, and FIG. 10, the substrate 10 includes a first side surface 101 and a second side surface 102, wherein the first side surface 101 and the second side surface 102 are respectively connected to two opposite sides of the top surface 100 of the substrate 10 and not parallel to the top surface 100. As shown in FIG. 7, substrate 10 further includes a third side surface 103 and a fourth side surface 104, wherein the third side surface 103 and the fourth side surface 104 are respectively connected to another two opposite sides of the top surface 100 of the substrate 10 and not parallel to the top surface 100. The first side surface 101, the second side surface 102, the third side surface 103 and the fourth side surface 104 form a periphery of the substrate 10.

As shown in FIG. 7, the third side surface 103 of the substrate 10 includes a first section 1031 of the third side surface and a second section 1032 of the third side surface. The fourth side surface 104 of the substrate 10 includes a first section 1041 of the fourth side surface and a second section 1042 of the fourth side surface. The first section 1031 of the third side surface and the first section 1041 of the fourth side surface are located on two opposite sides of the first light-emitting element 2a. The second section 1032 of the third side surface and the second section 1042 of the fourth side surface are located on two opposite sides of the first light-emitting element 2b.

The first light-emitting element 2a and the second light-emitting element 2b are formed on the top surface 100 of the substrate 10, wherein the first light-emitting element 2a and the second light-emitting element 2b each includes a first semiconductor layer 201, a second semiconductor layer 202, and an active layer 203 formed between the first semiconductor layer 201 and the second semiconductor layer 202.

As shown in FIG. 8, FIG. 9, FIG. 9A, and FIG. 10, the semiconductor stack 20 of the first light-emitting element 2a is selectively etched to form a first recess 204a and a first semiconductor mesa 205a. The semiconductor stack 20 of the second light-emitting element 2b is selectively etched to form a second recess 204b and a second semiconductor mesa 205b. For example, a photoresist pattern of the recess and the semiconductor mesa is formed by coating a photoresist and then removing a portion of the photoresist through a lithography process. The photoresist pattern is used to form the recess and the semiconductor mesa. Specifically, the semiconductor mesa is formed by removing portions of the second semiconductor layer 202 and the active layer 203 to form a structure including the first semiconductor layer 201, the second semiconductor layer 202, and the active layer 203. The first recess 204a and the second recess 204b are formed by removing portions of the second semiconductor layer 202 and the active layer 203 to expose the outer surface 204as and the outer surface 204bs of the first semiconductor layer 201. The remaining photoresist pattern is removed after the etching process.

As shown in FIG. 9 and FIG. 9A, the first recess 204a and the second recess 204b respectively includes a second surface S2 having an angle within a range with respect to the outer surfaces 200as, 204bs of the first semiconductor layer 201, for example, an angle between 10 and 80 degrees. If the angle is less than 10 degrees, an excessively low slope may reduce the area of the active layer 202, and a decreased area of the active layer 202 decreases the luminance of the light-emitting device 2. If the angle is greater than 80 degrees, the insulating layer and the metal layer subsequently formed may not completely cover the sidewalls of the first semiconductor layer 201, the second semiconductor layer 202, and/or the active layer 203, thereby causing cracking of the films formed thereon.

As shown in FIG. 7, in the top view of the light-emitting device 2, the light-emitting device 2 includes a first edge E1, a second edge E2, a third edge E3, and a fourth edge E4. The first semiconductor mesa 205a adjacent to the first edge E1 includes a first outer periphery 2051e and the second semiconductor mesa 205b adjacent to the second edge E2 includes a second outer periphery 2052e. In order to increase the light-emitting area of the light-emitting device 2, the first outer edge 2051e of the first semiconductor mesa 205a adjacent to the first edge E1 includes a plurality of concave parts 2050 and a plurality of convex parts 2051 alternately arranged as compared with the second outer periphery 2052e of the second semiconductor mesa 205b adjacent to the second edge E2. A first space D1 between one side of the convex part 2051 and the first edge E1 is smaller than a second space D2 between the second outer periphery 2052e and the second edge E2. A contour formed by the plurality of concave parts 2050 and the plurality of convex parts 2051 constitute a first outer periphery 2051e. In the top view of the light-emitting device 2, the first outer periphery 2051e includes a shape including wavy, zigzag or square. The position of the opening of the insulating layer, the contact layer, or the electrode layer subsequently formed can be determined according to the arrangement positions of the plurality of concave parts 2050 and the plurality of convex parts 2051.

In an embodiment, the first outer periphery 2051e of the first semiconductor mesa 205a adjacent to the first section 1031 of the third side surface and the outer periphery 2051e of the first semiconductor mesa 205a adjacent to the first section 1041 of the fourth side surface respectively include a plurality of concave parts 2050 and a plurality of convex parts 2051, wherein the plurality of concave parts 2050 and the plurality of convex parts 2051 are alternately arranged with each other. In an embodiment, the contour of the plurality of concave parts 2050 of the outer periphery 2051e of the first semiconductor mesa 205a adjacent to each side surface is the same or different from the contour of the plurality of convex parts 2051.

In another embodiment of the present application, the second outer periphery 2052e of the second semiconductor mesa 205b includes a shape including wavy, zigzag or square.

As shown in FIG. 7, the first corner 2051c of the first semiconductor mesa 205a and the second corner 2052c of the second semiconductor mesa 205b can be rounded to avoid the electrical current crowding locally at the corner of the light-emitting device 2.

As shown in FIG. 8, the first recess 204a is located at an outermost side of the semiconductor stack 20 of the first light-emitting element 2a, and the second recess 204b is located at an outermost side of the semiconductor stack 20 of the second light-emitting element 2b. The first recess 204a and the second recess 204b continuously or discontinuously expose the first semiconductor layer 201 of the outermost side of the semiconductor stack 20, the second semiconductor layer 203 and the active layer 202 of the first semiconductor mesa 205a is continuously or discontinuously surrounded by the first recess 204a, and the second semiconductor layer 203 and the active layer 202 of the second semiconductor mesa 205b is continuously or discontinuously surrounded by the second recess 204b, wherein a portion of the top surface 100 of the substrate 10 of the light-emitting element 2b is exposed to surround the first semiconductor layer 201 of the outermost side of the light-emitting element 2b.

In an embodiment, the first light-emitting element 2a includes one first recess 204a to continuously surround the first semiconductor mesa 205a, and the second light-emitting element 2b includes one second recess 204b to continuously surround the second semiconductor mesa 205b. The first recess 204a and the second recess 204b include a shape including a rectangular shape and are respectively located at the outermost side of the first light-emitting element 2a and the second light-emitting element 2b, wherein the corners of the rectangular shape can be rounded to prevent the electrical current locally crowding on the corners of each light-emitting element.

As shown in FIG. 7 and FIG. 9, the first semiconductor layer 201 of the first light-emitting element 2a adjacent to the first section 1031 of the third side surface 103 of the substrate 10 includes a first sidewall 2011 connected to the top surface 100 of the substrate 10 or directly connected to the third side surface 103 of the substrate 10. The first semiconductor layer 201 of the second light-emitting element 2b adjacent to the second section 1032 of the third side surface 103 of the substrate 10 includes a second sidewall 2012 inclined to the top surface 100 of the substrate 10 and spaced apart from the third side surface 103 of the substrate 10 by a first distance D to expose a portion of the top surface 100 of the substrate 10.

FIG. 9A illustrates a cross-sectional view taken along line H-H' of FIG. 7. As shown in FIG. 9A, the first semiconductor layer 201 of the first light-emitting element 2a adjacent to the first edge E1 includes a first sidewall 2011 connected to the top surface 100 of the substrate 10, and spaced apart from the first side surface 101 of the substrate 10 by a second distance D' to expose a portion of the top surface 100 of the substrate 10. The first semiconductor layer 201 of the second light-emitting element 2b adjacent to the second section 1042 of the fourth side E4 includes a second sidewall 20 inclined to the top surface 100 of the substrate 10, and spaced apart from the fourth side surface 104 of the substrate 10 by a first distance D to expose a portion of the top surface 100 of the substrate 10. The second distance D' is less than the first distance D.

In an embodiment of the present application, the first semiconductor layer 201 of the first light-emitting element 2a includes a plurality of first sidewalls 2011 and a third sidewall 2013 to form a first periphery of the first light-emitting element 2a, wherein the distances between the plurality of first sidewalls 2011 and the side surface of the substrate 10 are different. Specifically, the first side wall 2011 adjacent to the first edge E1 is connected to the top surface 100 of the substrate 10, and spaced apart from the first side surface 101 of the substrate 10 by a second distance D' to expose a portion of the top surface 100 of the substrate 10. The first sidewalls 2011 respectively adjacent to the third edge E3 and the fourth edge E4 are directly connected to the third side surface 103 and the fourth side surface 104 of the substrate 10, respectively. The third sidewall 2013 of the first semiconductor layer 201 of the first light-emitting element 2a forms one side of the trench 11 and the third sidewall 2013 is inclined to the top surface 100 of the substrate 10.

In another embodiment of the present application (not shown), the first semiconductor layer 201 of the first light-emitting element 2a includes a plurality of first sidewalls 2011 and a third sidewall 2012 to form a first periphery of the first light-emitting element 2a. The plurality of first sidewalls 2011 is respectively connected to the first side surface 101, the first section 1031 of the third side surface, and the first section 1041 of the fourth side surface. The third sidewall 2013 of the first semiconductor layer 201 of the first light-emitting element 2a form a side of the trench 11, and the third sidewall 2013 is inclined to the top surface 100 of the substrate 10.

In an embodiment of the present application, as shown in FIG. 7, FIG. 8, FIG. 9, FIG. 9A, and FIG. 10, the first semiconductor layer 201 of the second light-emitting element 2b includes a plurality of second sidewalls 2011 and a fourth sidewall 2014 to form a second periphery of the second light-emitting element 2b. The plurality of second sidewalls 2012 is respectively inclined to the top surface 100 of the substrate 10 and respectively separated from the second side surface 102, a second section 1032 of the third side surface, and a second section 1042 of the fourth side surface by a first distance D to expose a portion of the top surface 100 of the substrate 10. The fourth sidewall 2014 of the first semiconductor layer 201 of the first light-emitting element 2a form another side of the trench 11, and the fourth sidewall 2014 is inclined to the top surface 100 of the substrate 10.

In an embodiment of the present application, the first distances D between the plurality of second sidewalls 2012 and the second side surface 102, the second section 1032 of the third side surface, and the second section 1042 of the fourth side surface of the substrate 10 can be the same or different.

In an embodiment of the present application, as shown in FIG. 9, FIG. 9A and FIG. 10, the first distance D is preferably larger than 5 μm and less than 50 μm, more preferably less than 30 μm. The exposed top surface 100 is a rough surface. The rough surface may be a surface having an irregular shape or a surface having a regular shape. The irregular shape includes a plurality of pattern unit having different shapes or intervals, and the regular shape includes a plurality of pattern unit having substantially same shape or interval. The rough surface includes a plurality of hemispherical shapes protruding or recessed from the top surface 100, a surface having a plurality of cones protruding or recessed from the top surface 100, or a surface having a plurality of pyramids protruding or recessed from the top surface 100.

As shown in FIG. 9 and FIG. 9A, a first angle θ1 is between the first sidewall 2011 of the first semiconductor layer 201 of the first light-emitting element 2a and the top surface 100 of the substrate 10, and a second angle θ2 is between the second sidewall 2012 of the first semiconductor layer 201 of the second light-emitting element 2b and the top surface 100 of the substrate 10, and the second angle θ2 is different from the first angle θ1.

In an embodiment of the present application, the first angle θ1 is larger than the second angle θ2.

In an embodiment of the present application, the first angle θ1 is between 70 and 90 degrees. The second angle θ2 is between 20 and 70 degrees.

In an embodiment of the present application, the angle difference between the first angle θ1 and the second angle θ2 is larger than 20 degrees.

In an embodiment of the present application, the third sidewall 2013 of the first light-emitting element 2a is inclined to the top surface 100 of the substrate 10 by a third angle θ3, and the fourth sidewall 2014 of the second light-emitting element 2b is inclined to the top surface 100 of the substrate 10 by a fourth angle θ4.

In an embodiment of the present application, the third angle θ3 is different from the fourth angle θ4. The third angle θ3 and the fourth angle θ4 are respectively between 20 and 70 degrees.

In an embodiment of the present application, the difference between the third angle θ3 and the fourth angle θ4 is smaller than 20 degrees.

In an embodiment of the present application, the third angle θ3 is larger than the fourth angle θ4. The third angle θ3 and the fourth angle θ4 are respectively between 20 and 70 degrees.

In an embodiment of the present application, the third angle θ3 is smaller than the fourth angle θ4. The third angle θ3 and the fourth angle θ4 are respectively between 20 and 70 degrees.

In an embodiment of the present application, the second angle θ2 is different from the third angle θ3. The second angle θ2 and the third angle θ3 are respectively between 20 and 70 degrees.

In an embodiment of the present application, the second angle θ2 is larger than the third angle θ3. The second angle θ2 and the third angle θ3 are respectively between 20 and 70 degrees.

In an embodiment of the present application, the second angle θ2 is smaller than the third angle θ3. The second angle θ2 and the third angle θ3 are respectively between 20 and 70 degrees.

As shown in FIG. 7 and FIG. 8, a first insulating layer 30 is formed on the semiconductor stack 20 of the first light-emitting element 2a and the second light-emitting element 2b. One or a plurality of first openings 301 of the first insulating layer 30 are formed on the first recess 204a adjacent to the first edge E1 to expose the first semiconductor layer 201 of the first recess 204a of the first light-emitting element 2a. One or a plurality of second openings 302 of the first insulating layer 30 are formed on the second recess 204b adjacent to the second edge E2 to expose the first semiconductor layer 201 of the second recess 204b of the second light-emitting element 2b. The third openings 303a, 303b of the first insulating layer 30 are respectively formed on the first light-emitting element 2a and the second light-emitting element 2b to expose the second semiconductor layer 202.

In an embodiment of the present application, as shown in FIG. 7 and FIG. 8, the position of the openings of the first insulating layer 30 is provided to determine the positions of the contact layer and the electrode subsequently formed. In order to uniformly spread the electrical current at the outer edge of the light-emitting device 2, the plurality of second openings 302 of the first insulating layer 30 adjacent to the second edge E2 include an amount equal to the amount of the plurality of first openings 301 of the first insulating layer 30 adjacent to the first edge E1.

As shown in FIG. 7 and FIG. 8, in order to provide same areas of the first semiconductor layer 201 exposed by the first opening 301 of the first insulating layer 30 and the second opening 302 of the first insulating layer 30, the second opening 302 of the first insulating layer 30 adjacent to the second edge E2 includes a maximum length 302w greater than a maximum length 301w of the first opening 301 of the first insulating layer 30 adjacent to the first edge E1.

As shown in FIG. 8, FIG. 9, and FIG. 9A, a first contact electrode 40a is formed in the third opening 303a of the first insulating layer 30 of the first light-emitting element 2a to ohmic contact the second semiconductor layer 202 of the first light-emitting element 2a. A second contact electrode 40b is formed in the third opening 303b of the first insulating layer 30 of the second light-emitting element 2b to ohmic contact the second semiconductor layer 202 of the second light-emitting element 2b. The first contact electrode 40a and the second contact electrode 40b include transparent electrode. The material of the transparent electrode includes a transparent conductive oxide or a transparent thin metal.

The thickness of the first contact electrode 40a and the second contact electrode 40b is not limited, but may respectively include a thickness between 0.1 nm and 200 nm. In an embodiment, the material of the first contact electrode 40a and the second contact electrode 40b includes a transparent conductive oxide. If the thickness of the first contact electrode 40a or the second contact electrode 40b is less than 0.1 nm, the thickness of the first contact electrode 40a or the second contact electrode 40b is too thin and not able to form an ohmic contact with the second semiconductor layer 202. If the thickness of the first contact electrode 40a or the second contact electrode 40b is larger than 200 nm, the first contact electrode 40a and the second contact electrode 40b having the thick thickness may partially absorb the light emitted from the active layer 203, and the luminance of the light-emitting device 2 is reduced. Since the first contact electrode 40a and the second contact electrode 40b have a thickness range described above, the current can be uniformly spread in the horizontal direction to improve the electrical performance of the light-emitting device 2. However, the above embodiments do not exclude other materials being capable of lateral current spreading The first contact electrode 40a and the second contact electrode 40b are formed on the surface of the second semiconductor layer 202, and form a low-resistance contact with the second semiconductor layer 202, such as an ohmic contact. The electrical current is uniformly spread through the second semiconductor layer 202 by the first contact electrode 40a and the second contact electrode 40b. In an embodiment, in the cross-sectional view of the light-emitting device 2, the first contact electrode 40a and the second contact electrode 40b respectively includes an outermost side which is separated from the first recess 204a and the second recess 204b by a horizontal distance less than 20 μm, preferably less than 10 μm, and more preferably less than 5 μm.

As shown in FIG. 8, FIG. 9, and FIG. 9A, a first reflective layer 50a is formed on the first contact electrode 40a and a second reflective layer 50b is formed on the second contact electrode 40b. The material of the first reflective layer 50a and the second reflective layer 50b includes metal material such as aluminum (Al), silver (Ag), rhodium (Rh), platinum (Pt) or an alloy of the above materials. The first reflective layer 50a and the second reflective layer 50b reflect a light and the reflected light emits outward toward the substrate 10, wherein the light is formed in the active layer 203.

In another embodiment, the step of forming the first contact electrode 40a and the second contact electrode 40b may be omitted. The first reflective layer 50a and the second reflective layer 50b are respectively formed in the third openings 303a and 303b of the first insulating layer 30. The first reflective layer 50a and the second reflective layer 50b ohmic contact with the second semiconductor layer 202.

In an embodiment, in the cross-sectional view of the light-emitting device 5, as shown in FIG. 9 and FIG. 10, the first reflective layer 50a and the second reflective layer 50b respectively includes an outermost side that is separated from the first recess 204a and the second recess 204b by a horizontal distance less than 20 μm, preferably less than 10 μm, more preferably less than 5 μm.

In another embodiment, a barrier layer (not shown) is formed on the first reflective layer 50a and the second reflective layer 50b to respectively cover the top surface and the side surface of the first reflective layer 50a and the second reflective layer 50b to avoid surface oxidation of the first reflective layer 50a and the second reflective layer 50b which deteriorated the reflectance of the first reflective layer 50a and the second reflective layer 50b. The material of the barrier layer includes a metal.

As shown in FIG. 9, FIG. 9A, and FIG. 10, the light-emitting device 2 includes a second insulating layer 60 formed on the semiconductor stack 20 of the first light-emitting element 2a and the second light-emitting element 2b. One or a plurality of first openings 600 of second insulating layer 60 is formed on the first recess 204a by selectively etching method to expose the first semiconductor layer 201 of the first recess 204a of the first light-emitting element 2a. One or a plurality of second openings 602 of the second insulating layer 60 is formed on the second recess 204b to expose the first semiconductor layer 201 on the second recess 204b of the second light-emitting element 2b. One or a plurality of third openings 603a of the second insulating layer 60 is formed on the first light-emitting element 2a to expose the second semiconductor layer 202, the reflective layer 50a, and/or the barrier layer of the first light-emitting element 2a. A fourth openings 603b of the second insulating layer 60 is formed on the second light-emitting element 2b to expose the second semiconductor layer 202, the reflective layer 50b, and/or the barrier layer of the second light-emitting element 2b.

The forming positions of the first opening 601 of the second insulating layer 60, the second opening 602 of the second insulating layer 60 and the fourth opening 603b of the second insulating layer 60 are respectively corresponding to that of the first opening 301 of the first insulating layer 30, the second opening 302 of the first insulating layer 30 and the third opening 303b of the first insulating layer 30. A forming position of the third opening 603a of the second insulating layer 60 overlaps with that of the third opening 303b of the first insulating layer 30.

As shown in FIG. 7 and FIG. 8, the area of the first semiconductor layer 201 exposed by the first opening 601 of the second insulating layer 60 and the area of the first semiconductor layer 201 exposed by the second opening 602 of the second insulating layer 60 are substantially the same, the plurality of second openings 602 of the second insulating layer 60 on the second light-emitting element 2b respectively includes a maximum length 602w, which is greater than a maximum length 601w of one of plurality of first openings 601 of the second insulating layer 60 on the first light-emitting element 2a.

The position of the opening of the second insulating layer 60 may be used to determine the position of the electrode subsequently formed. As shown in FIG. 7, FIG. 8 and FIG. 10, in order to uniformly spread the electrical current at the outer edge of the light-emitting device 2, the second insulating layer 60 further includes one or more openings 600 of the second insulating layer 60 formed between the first light-emitting element 2a and the second light-emitting element 2b. The openings 600 of the second insulating layer 60 includes one or a plurality of first cell openings 600a of the second insulating layer 60 exposing the first semiconductor layer 201 located on the first recess 204a of the first light-emitting element 2a; and one or a plurality of second cell openings 600b of the second insulating layer 60 exposing the first semiconductor layer 201 located on the second recess 204b of the second light-emitting element 2b.

In another embodiment, the plurality of first cell openings 600a of the second insulating layer 60 and the plurality of third openings 603a of the second insulating layer 60 are located on the same side of the first light-emitting element 2a, and the plural of first cell openings 600a of the second insulating layer and the plurality of third openings 603a of the second insulating layer 60 are alternately arranged with each other. In order to increase the injection current and reduce the loss of the light-emitting area, the number of the third openings 603a of the second insulating layer 60 is more than that of the plurality of first cell openings 600a of the second insulating layer 60. The amount of the first cell openings 600a of the second insulating layer 60 is the same as the amount of the second cell openings 600b of the second insulating layer 60. The first cell opening 600a of the second insulating layer 60 and the second cell opening 600b of the second insulating layer 60 are connected in the top view of the light-emitting device 2.

The second insulating layer 60 includes an insulating material having light transparency. For example, the second insulating layer 60 includes $SiO_x$.

In an embodiment of the present application, the second insulating layer 60 includes a thickness ranged between 1000 Å and 60,000 Å.

As shown in FIG. 9, FIG. 9A, and FIG. 10, the second insulating layer 60 includes a side surface having an angle between 10 and 70 degrees with respect to a horizontally extending surface of the outer surface 204as of the first semiconductor layer 201 exposed through the selective etching If the angle of the side surface of the first insulating layer 60 is less than 10 degrees, the thickness of the second insulating layer 60 will be substantially reduced. Therefore, it will be difficult to ensure the insulation properties.

If the angle of the side surface of the second insulating layer 60 is greater than 70 degrees, the insulating layer and the metal layer subsequently formed may not completely cover the second insulating layer 60, thereby causing the film cracking.

In an embodiment of the present application, the side surface of the second insulating layer 60 has an angle between 20 and 75 degrees, preferably between 30 and 65 degrees, more preferably between 40 and 55 degrees.

As shown in FIG. 7, FIG. 9 and FIG. 9A, the light-emitting device 2 includes one or a plurality of connecting electrodes 70 formed between the first light-emitting element 2a and the second light-emitting element 2b. The one or the plurality of connecting electrodes 70 respectively includes a first connecting section 701 formed on the first recess 204a of the first light-emitting element 2a, extending to cover and electrically connected the second semiconductor layer 202 of the first light-emitting element 2a; a second connecting section 702 formed on the second recess 204b of the second light-emitting element 2b and electrically connected to the first semiconductor layer 201 of the first light-emitting element 2b; and a third connecting section 703 formed in the trench 11, disposed between the first recess 204a and the second recess 204b, and between the first connecting section 701 and the second connecting section 702.

As shown in FIG. 9 and FIG. 9A, the first insulating layer 30 and/or the second insulating layer 60 are formed between the first connecting section 701 and the first semiconductor layer 201. The first insulating layer 30 and/or the second insulating layer 60 are formed between the second connecting section 702 and the first semiconductor layer 201.

In an embodiment of the present application, in the top view of the light-emitting device 2, the connecting electrode 70 includes a width of at least 15 μm or more, preferably more than 30 μm, and more preferably more than 50 μm.

As shown in FIG. 7, FIG. 9, and FIG. 9A, the light-emitting device 2 includes a first bottom electrode 71a on the first light-emitting element 2a, a second bottom electrode 71b on the second light-emitting element 2b, and a second top electrode 72b on the second light-emitting element 2b. The external current is injected into the light-emitting device 2 through the first bottom electrode 71a and the second top electrode 72b, and electrically connects the first light-emitting element 2a and the second light-emitting element 2b in series through the second connecting section 702 of the connecting electrode 70 extended from the second bottom electrode 71b, the third connecting section 703 in the trench 11 and the first connecting section 701.

As shown in FIG. 7, FIG. 9, and FIG. 9A, the second insulating layer 60 is located between the second connecting section 702 and the first semiconductor layer 201 of the second light-emitting element 2b to prevent the second connecting section 702 from directly contacting the first semiconductor layer 201 of the second light-emitting element 2b. As shown in FIG. 7 and FIG. 10, the second element opening 600b of the second insulating layer 60 exposes the first semiconductor layer 201 on the second recess 204b of the second light-emitting element 2b. The second bottom electrode 71b directly contacts the first semiconductor layer 201 of the second light-emitting element 2b through the second element opening 600b of the second insulating layer 60. The current flowing through the second connecting section 702 is conducted to the first semiconductor layer 201 of the second light emitting element 2b by the second bottom electrode 71b of the second light-emitting element 2b.

The connecting electrode 70, the first bottom electrode 71a, the second bottom electrode 71b and/or the second top electrode 72b include a metal material including chromium (Cr), titanium (Ti), tungsten (W), gold (Au), aluminum (Al), indium (In), tin (Sn), nickel (Ni), platinum (Pt) or an alloy of the above materials. The connecting electrode 70, the first bottom electrode 71a, the second bottom electrode 71b and/or the second top electrode 72b include single layer or multilayers. For example, the connecting electrode 70, the first bottom electrode 71a, the second bottom electrode 71b and/or the second top electrode 72b include Ti/Au stack, Ti/Pt/Au stack, Cr/Au stack, Cr/Pt/Au stack, Ni/Au stack, Ni/Pt/Au stack or Cr/Al/Cr/Ni/Au stack.

The connecting electrode 70, the first bottom electrode 71a, the second bottom electrode 71b and/or the second top electrode 72b include a thickness preferably between 0.5 μm and 3.5 μm.

As shown in FIG. 9, FIG. 9A, and FIG. 10, the light-emitting device 2 includes a third insulating layer 80 formed on the first light-emitting element 2a and the second light-emitting element 2b. A first opening 801 of the third insulating layer 80 is formed on the first bottom electrode 71a by selective etching to expose a top surface of the first bottom electrode 71a. A second opening 802 of the third insulating layer 80 is formed on the second top electrode 72b to expose a top surface of the second top electrode 72b.

The second insulating layer 60 or the third insulating layer 80 includes an insulating material having light transparency. For example, the third insulating layer 80 includes $SiO_x$.

As shown in FIG. 7, FIG. 9, FIG. 9A, and FIG. 10, the light-emitting device 2 includes a first electrode pad 91 to cover the first opening 801 of the third insulating layer 80 and contact the first bottom electrode 71a. The first electrode pad 91 is electrically connected to the first semiconductor layer 201 of the first light-emitting element 2a by the first bottom electrode 71a. The light-emitting device 2 includes a second electrode pad 92 covering the second opening 802 of the third insulating layer 80 and contacting the second top electrode 72b.

In an embodiment, as shown in FIG. 9, the first sidewall 2011 of the first semiconductor layer 201 near the first section 1031 of the third side surface is not covered by the third insulating layer 80. The second sidewall 2012 of the first semiconductor layer 201 near the second section 1032 of the third side surface is covered by the third insulating layer 80.

In an embodiment, as shown in FIG. 9A, the first sidewall 2011 of the first semiconductor layer 201 near the first side surface 101 of the substrate 10 is covered by the third insulating layer 80. The second sidewall 2012 of the first semiconductor layer 201 near the second section 1042 of the fourth side surface is covered by a third insulating layer.

In an embodiment, as shown in FIG. 10, the first sidewall 2011 of the first semiconductor layer 201 adjacent to the first section 1041 of the fourth side surface 104 is not covered by the third insulating layer 80. The second sidewall 2012 of the first semiconductor layer 201 near the second section 1042 of the fourth side surface 104 is covered by the third insulating layer 80.

The first electrode pad 91 and the second electrode pad 92 include a metal material including chromium (Cr), titanium (Ti), tungsten (W), gold (Au), aluminum (Al), indium (In), tin (Sn), nickel (Ni), platinum (Pt) or an alloy of the above materials. The first electrode pad 91 and the second electrode pad 92 include single layer or multilayers. For example, the first electrode pad 91 or the second electrode pad 92 includes Ti/Au stack, Ti/Pt/Au stack, Cr/Au stack, Cr/Pt/Au stack, Ni/Au stack, Ni/Pt/Au stack or Cr/Al/Cr/Ni/Au stack.

In an embodiment of the present application, the first electrode pad 91 includes a size that is the same as or different from a size of the second electrode pad 92. The size includes a width or an area. For example, a top area of the first electrode pad 91 or the second electrode pad 92 may be 0.8 times or more and less than one time a sum obtained by adding the top areas of the first electrode pad 91 and the second electrode pad 92.

The first electrode pad 91 or the second electrode pad 92 respectively includes an inclined side surface, and the cross-sectional area of the first electrode pad 91 or the second electrode pad 92 varies along the thickness direction of the light-emitting device 2. For example, the cross-sectional area of the first electrode pad 91 or the second electrode pad 92 gradually diminishes away from the upper surface of the semiconductor stack 20.

The first electrode pad 91 or the second electrode pad 92 includes a thickness between 1 and 100 μm, preferably between 1.5 and 6 μm.

A space is between the first electrode pad 91 and the second electrode pad 92, and the space includes a distance between 10 μm and 250 μm. In the distance range described above, the top view area of the first electrode pad 91 and the second electrode pad 92 can be increased by reducing the distance of the space between the first electrode pad 91 and the second electrode pad 92. The heat dissipation efficiency of the light-emitting device 1 can be improved, and a short circuit between the first electrode pad 91 and the second electrode pad 92 also can be avoided.

FIG. 11 illustrates a cross-sectional view taken along line F-F' of FIG. 7. FIG. 12 illustrates a cross-sectional view taken along line G-G' of FIG. 7

In an embodiment of the present application, as shown in FIG. 7, in the top view of the light-emitting device 2, the light-emitting device 2 includes a plurality of corners, wherein the plurality of corners includes a first corner C1, a second corner C2, a third corner C3 and a fourth corner C4. The light-emitting device 2 includes a plurality of semiconductor structures 206, wherein the plurality of semiconductor structures 206 includes a first semiconductor structure 2061, a second semiconductor structure 2062, a third semiconductor structure 2063, and a fourth semiconductor structure 2064. The positions of the first semiconductor structure 2061, the second semiconductor structure 2062, the third semiconductor structure 2063, and the fourth semiconductor structure 2064 are respectively located at the first corner C1, the second corner C2, the third corner C3, and the fourth corner C4.

In another embodiment of the present application (not shown), the light-emitting device 2 includes a plurality of edges, wherein the plurality of edges includes a first edge E1, a second edge E2, a third edge E3, and a fourth edge E4. A plurality of semiconductor structures 206 is respectively located on the plurality of edges.

As shown in FIG. 7, FIG. 11, and FIG. 12, the first semiconductor structure 2061 and the fourth semiconductor structure 2064 are respectively separated from the first semiconductor mesa 205a by a distance, and the first semiconductor structure 2061 and the fourth semiconductor Structures 2064 are separated from each other. The second semiconductor structure 2062 and the third semiconductor structure 2063 are respectively separated from the second semiconductor mesa 205b by a distance, and the second semiconductor structure 2062 and the third semiconductor structure 2063 are separated from each other.

As shown in FIG. 11, the first semiconductor structure 2061 adjacent to the first edge E1 is separated from the first semiconductor mesa 205a by a first shortest distance L1, and the fourth semiconductor structure 2064 adjacent to the first edge E1 is separated from the semiconductor mesa 205a by a fourth shortest distance L4 (not shown). As shown in FIG. 12, the second semiconductor structure 2062 adjacent to the second edge E2 is separated from the second semiconductor mesa 205b by a second shortest distance L2, and the third semiconductor structure 2063 adjacent to the second edge E2 is separated from the second semiconductor mesa 205b by a third shortest distance L3 (not shown).

In an embodiment of the present application, the second shortest distance L2 and the third shortest distance L3 are respectively larger than the first shortest distance L1.

As shown in FIG. 7 and FIG. 11, in an embodiment of the present application, the first semiconductor layer 201 adjacent to the first corner C1 is located between the first semiconductor structure 2061 and the first semiconductor mesa 205a, and connects the first semiconductor structure 2061 and the first semiconductor mesa 205a. The first semiconductor layer 201 adjacent to the fourth corner C4 is located between the fourth semiconductor structure 2064 and the first semiconductor mesa 205a, and connects the fourth semiconductor structure 2064 with the first semiconductor mesa 205a (not shown). As shown in FIG. 7 and FIG. 12, in an embodiment of the present application, the first semiconductor layer 201 adjacent to the second corner C2, and between the second semiconductor structure 2062 and the second semiconductor mesa 205b is removed to expose the substrate 10, and the second semiconductor structure 2062 and the second semiconductor mesa 205b are separated from each other. Adjacent to the third corner C3, the first semiconductor layer 201 between the third semiconductor structure 2063 and the second semiconductor mesa 205b is removed to expose the substrate 10, and the third semiconductor structure 2063 and the second semiconductor mesa 205b are separated from each other (not shown).

In an embodiment of the present application, in the top view of the light-emitting device 2, the first semiconductor structure 2061, the second semiconductor structure 2062, the third semiconductor structure 2063, and the fourth semiconductor structure 2064 include a shape including rectangular, triangular or fan shape.

Figure 13A:
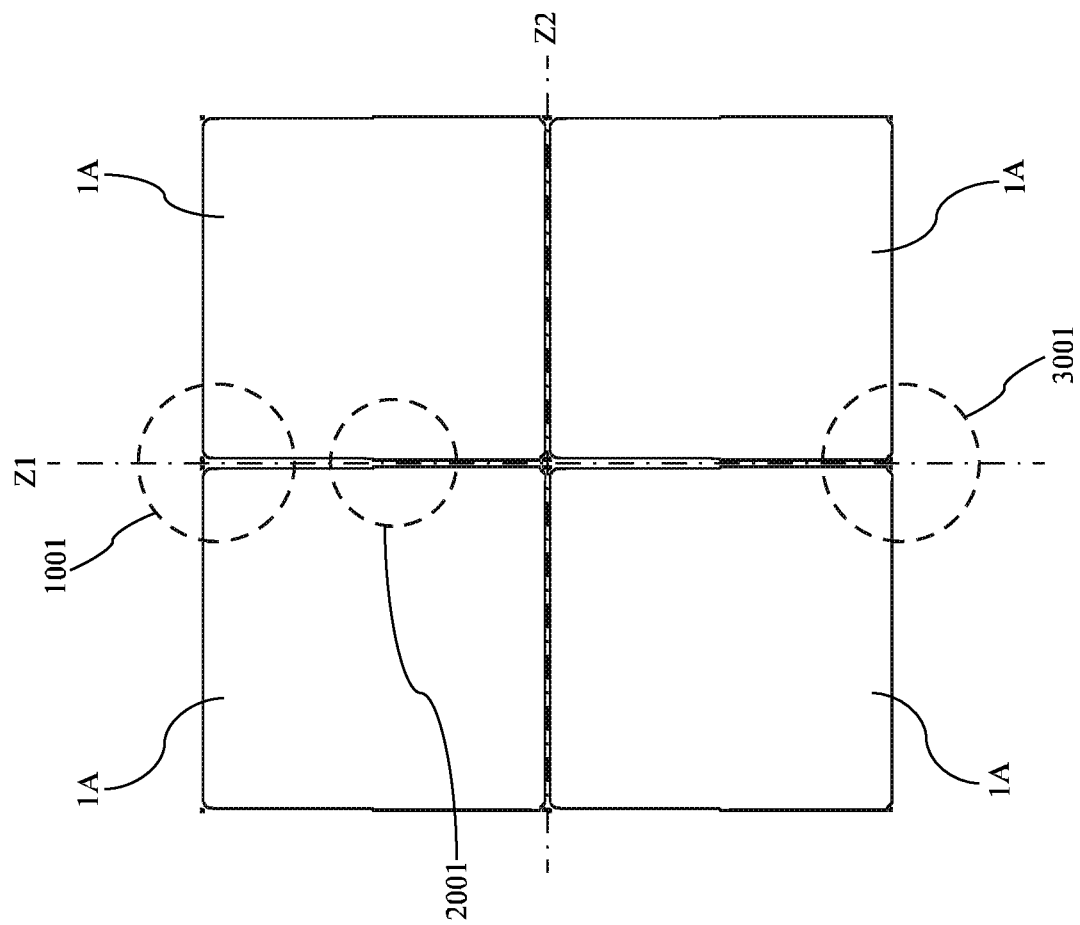
FIG. 13A illustrates a manufacturing method of a light-emitting device 1A in accordance with an embodiment of the present application.
Figure 13B:
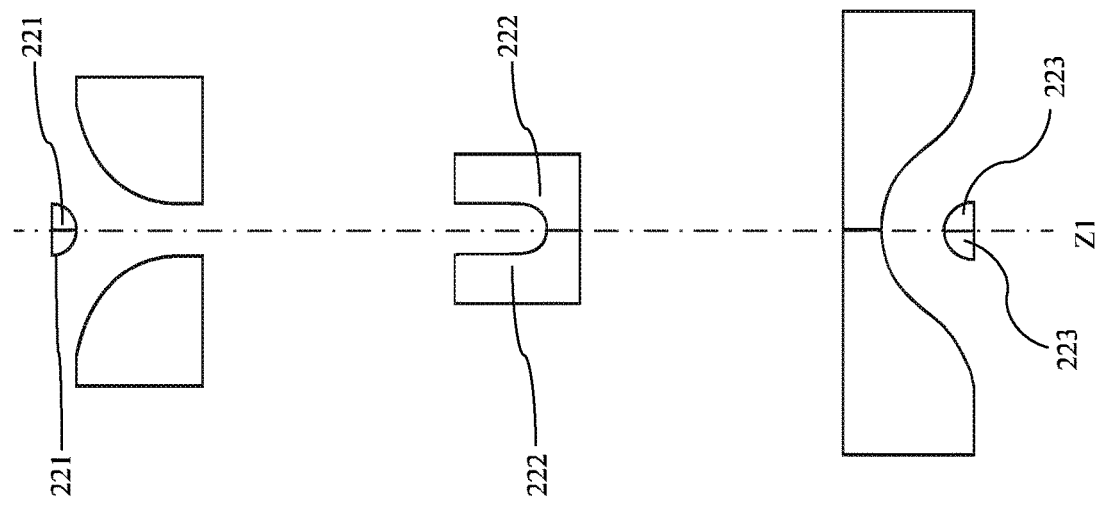
FIG. 13B illustrates the manufacturing method of the light-emitting device 1A in accordance with an embodiment of the present application.
Figure 13C:
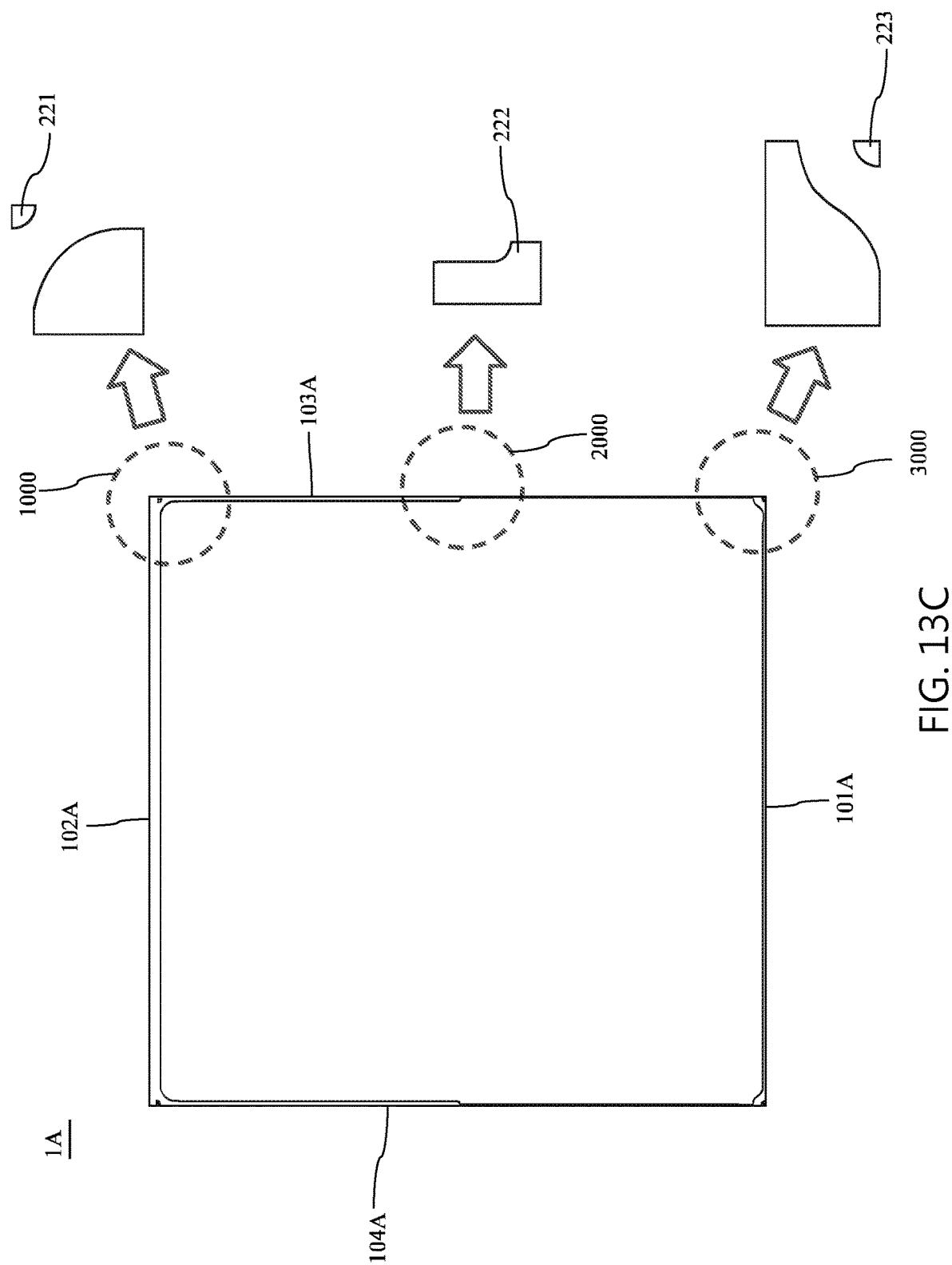
FIG. 13C illustrates a top view of the light-emitting device 1A in accordance with an embodiment of the present application.

FIG. 13A illustrates a manufacturing method of a light-emitting device 1A in accordance with an embodiment of the present application. FIG. 13B illustrates the manufacturing method of the light-emitting device 1A in accordance with an embodiment of the present application. FIG. 13C illustrates a top view of the light-emitting device 1A in accordance with an embodiment of the present application.

FIG. 13A is a partial top view of the wafer in the manufacturing process of the light-emitting device 1A on the wafer.

As described above, the wafer including gallium arsenide (GaAs) wafer, sapphire ($Al_2O_3$) wafer, gallium nitride (GaN) wafer, or silicon carbide (SiC) wafer is used as a growth substrate. Growing the semiconductor stack on the growing substrate by metal organic chemical vapor deposition (MOCVD), molecular beam epitaxy (MBE), hydride vapor deposition (HVPE), physical vapor deposition (PVD) or ion plating, for example, a light-emitting structure composed of a first semiconductor layer, a second semiconductor layer, and an active layer. The electrodes and the insulating layers are subsequently formed by the lithography process and the etching process.

After forming a wafer including a semiconductor light-emitting device thereof, the wafer is separated into individual semiconductor light-emitting devices by dicing. Since the size of the light-emitting device has a tendency to gradually decrease according to different applications, for example, the area of a single light-emitting device is less than 100,000 $\mu m^2$, if the accuracy of the dicing is not precise enough, the production yield of the light-emitting device is affected. Therefore, in the dicing process, it is necessary to provide a reference point preserved to the dicing device (not shown) so that the dicing device can be accurately positioned on the dicing path. The disclosure provides an identification method and identification structure assisting the accuracy of the dicing to improve the production yield of the light-emitting device.

Refer to FIG. 13A and FIG. 13B. FIG. 13B is a partially enlarged view of positions 1001, 2001 and 3001 shown in FIG. 13A. The scribe lines Z1, Z2 are formed on the wafer including the light-emitting device 1A to define a plurality of light-emitting devices 1A. A second identification structure 222 is disposed on a side of the light-emitting device 1A adjacent to the scribe line Z1, and/or a first identification structure 221 and a third identification structure 223 are respectively disposed on two corners adjacent to the aforementioned side. The identification structures 221, 222 and 223 are used as markings for the dicing device to identify the position of the scribe line Z1.

In an embodiment of the present application, a plurality of light-emitting devices 1A is arranged in an array on the wafer. In order to accurately dice the plurality of light-emitting devices 1A, a second identification structure 222 is disposed on each side of the light-emitting device 1A, or a first identification structure 221 or a third identification structure 223 is disposed on each corner of the light-emitting device 1A. The first identification structure 221, the second identification structure 222, and/or the third identification structure 223 include a semiconductor structure.

In an embodiment, the semiconductor structure of the second identification structure 222, the first identification structure 221, and/or the third identification structure 223 includes a semiconductor stack.

In an embodiment of the present application, as shown in FIG. 13C, the light-emitting device 1A includes a semiconductor stack, the first identification structure 221 at the corner position 1000, the second identification structure 222 at the edge 2000, and the third identification structure 22 at the corner 3000, wherein the first identification structure 221, the second identification structure 222 and the third identification structure 22 respectively includes the semiconductor structure. The light-emitting device 1A includes the plurality of edges and the plurality of corners, wherein the corner is formed by two adjacent edges. The plurality of edges includes a first edge 101A, a second edge 102A, a third edge 103A, and a fourth edge 104A. The plurality of semiconductor structures is respectively located on the plurality of corners or the plurality of sides. The plurality of semiconductor structures is located at the plurality of corners. For example, the first identification structure 221 or the third identification 223 are separated from the semiconductor stack by a distance. In an embodiment, the first identification structure 221 is separated from the semiconductor stack by the distance mentioned above, the first identification structure 221 does not connect to the semiconductor stack and there is no semiconductor layer between the first identification structure 221 and the semiconductor stack; the third identification structure 223 is connected to the semiconductor stack with the semiconductor layers. The distance mentioned above exposes the semiconductor stack or the surface of the substrate. The plurality of semiconductor structures, such as the first identification structure 221 or the third identification structure 223, are separated from each other. The plurality of semiconductor structures on the plurality of edges, such as the second identification structure 222, is directly connected to the semiconductor stack.

Figure 14:
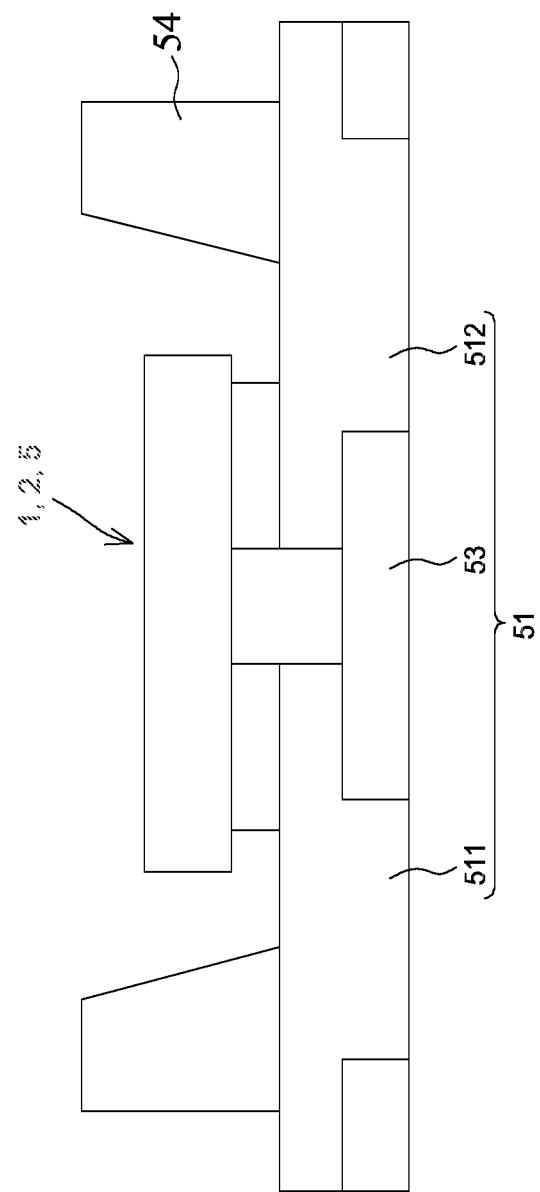
FIG. 14 illustrates a schematic view of a light-emitting apparatus 3 in accordance with an embodiment of the present invention.

FIG. 14 is a schematic view of a light-emitting apparatus 3 in accordance with an embodiment of the present application. The light-emitting device 1, 1A, 2 or 5 in the foregoing embodiment is mounted on the first spacer 511 and the second spacer 512 of the package substrate 51 in the form of flip chip. The first spacer 511 and the second spacer 512 are electrically insulated from each other by an insulating portion 53 including an insulating material. The main light-extraction surface of the flip chip is one side of the growth substrate opposite to the electrode-forming surface where the electrodes are formed on. A reflective structure 54 can be provided around the light-emitting device 1, 1A, 2 or 5 to increase the light extraction efficiency of the light-emitting apparatus 3.

Another object of the present application is to provide a light-emitting device and a manufacturing method thereof which improve the reliability of a package device.

The light-emitting device 1 is illustrated as an example, when the light-emitting device 1 is flipped to be mounted onto the first spacer 511 and the second spacer 512 of the package substrate 51, the first electrode pad 91 is bonded to the first spacer 511 through the solder, and the second electrode pad 92 is bonded to the second spacer 512 through the solder. Since the first electrode pad 91 is electrically connected to the first semiconductor layer 201, even the solder overflows from the first electrode pad 91 to contact the first semiconductor layer 201, the light-emitting device 1 does not have leakage failure. However, the second electrode pad 92 is electrically connected to the second semiconductor layer 202, and if the solder overflows from the second electrode pad 92 to contact the first semiconductor layer 201, the light-emitting device 1 fails because of electrical discharge. The present application is to improve the reliability of the light-emitting device by forming the third insulating layer 80 to cover the outer surface 204s and the second side wall 2012 of the first semiconductor layer 201 on the side close to the second electrode pad 92, thereby improving the reliability of the light-emitting device. Further, since the first semiconductor layer 201 adjacent to the first electrode pad 91 does not need to be covered by insulating layers, it is also possible to reduce the area where the semiconductor layers are removed, thereby improving the brightness of the light-emitting device.

Figure 15:
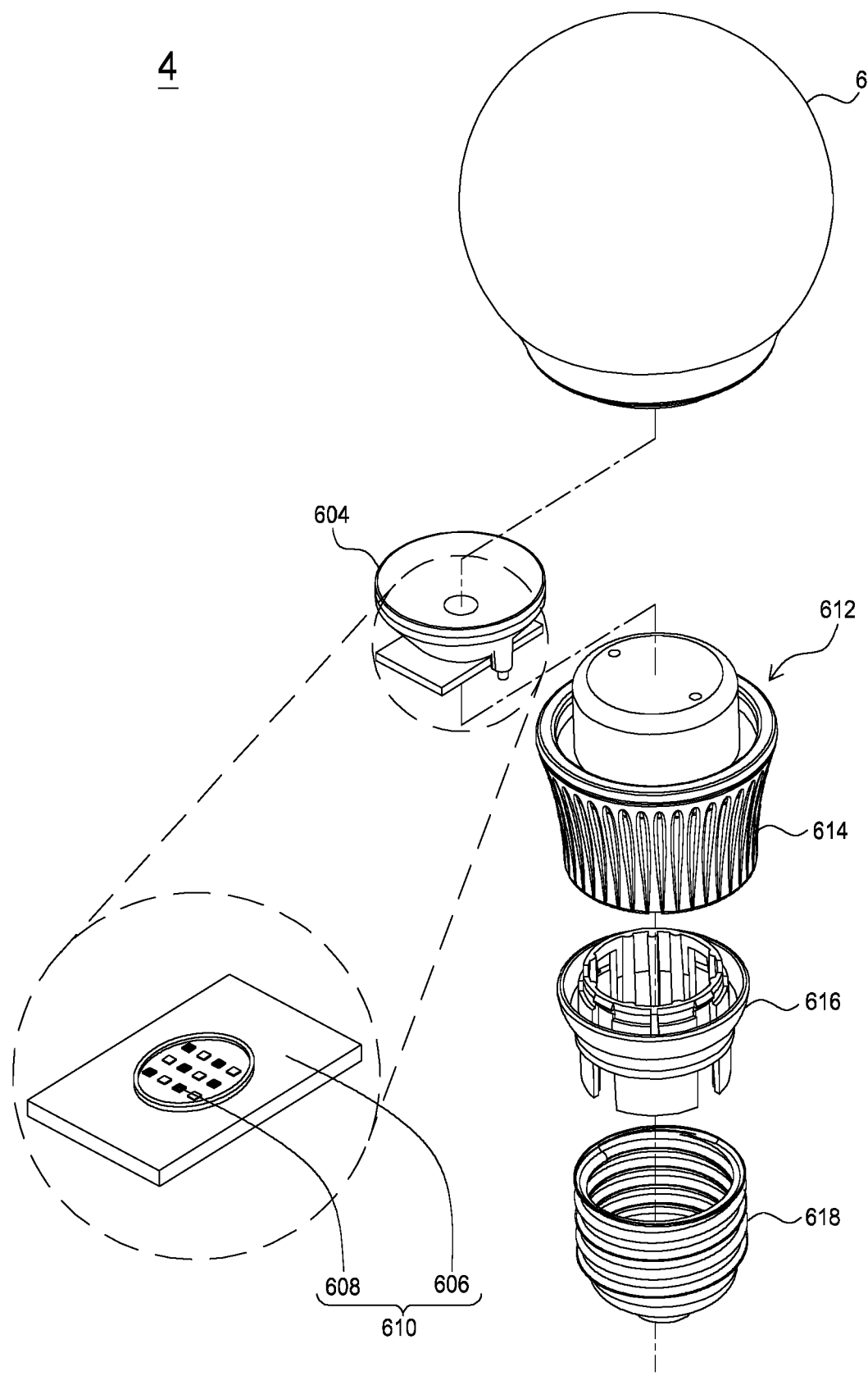
FIG. 15 illustrates a schematic view of a light-emitting apparatus 4 in accordance with an embodiment of the present invention.

FIG. 15 illustrates a structure diagram of a light-emitting apparatus 4 in accordance with an embodiment of the present application. A light bulb includes an envelope 602, a lens 604, a light-emitting module 610, a base 612, a heat sink 614, a connector 616 and an electrical connecting device 618. The light-emitting module 610 includes a submount 606 and a plurality of light-emitting devices 608 on the submount 606, wherein the plurality of light-emitting devices 608 can be the light-emitting device 1, 1A, 2, 5 or the light-emitting apparatus 3 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, including:
a substrate including a top surface, a first side surface and a second side surface, wherein the first side surface and the second side surface of the substrate are respectively connected to two opposite sides of the top surface of the substrate;
a semiconductor stack formed on the top surface of the substrate, the semiconductor stack including a first semiconductor layer, a second semiconductor layer, and an active layer formed between the first semiconductor layer and the second semiconductor layer;
a first electrode pad formed adjacent to a first edge of the light-emitting device; and
a second electrode pad formed adjacent to a second edge of the light-emitting device, wherein in a top view of the light-emitting device, the first edge and the second edge are formed on different sides or opposite sides of the light-emitting device, the first semiconductor layer adjacent to the first edge includes a first sidewall directly connected to the first side surface of the substrate, and the first semiconductor layer adjacent to the second edge includes a second sidewall separated from the second side surface of the substrate by a distance, and wherein the second sidewall of the first semiconductor layer directly contacts the top surface of the substrate.

2. The light-emitting device according to claim 1, wherein a first angle is between the first sidewall of the first semiconductor layer and the top surface of the substrate, a second angle is between the second sidewall of the first semiconductor layer and the top surface of the substrate, and the second angle is different from the first angle.

3. The light-emitting device according to claim 2, wherein the first angle is larger than the second angle.

4. The light-emitting device according to claim 3, wherein the first angle is between 70 degrees and 90 degrees.

5. The light-emitting device according to claim 3, wherein the second angle is between 20 degrees and 70 degrees.

6. The light-emitting device according to claim 1, further including an insulating layer formed on the semiconductor stack, wherein the first sidewall of the first semiconductor layer is not covered by the insulating layer, and the second sidewall of the first semiconductor layer is covered by the insulating layer.

7. The light-emitting device according to claim 6, wherein the insulating layer includes a first side surface of the insulating layer directly connected to the first sidewall of the first semiconductor layer, and a second side surface of the insulating layer formed between the second side surface of the substrate and the second sidewall of the first semiconductor layer and spaced apart from the second side surface of the substrate to expose the top surface of the substrate.

8. The light-emitting device according to claim 6, wherein a portion of the top surface of the substrate adjacent to the second edge is not covered by the insulating layer.

9. The light-emitting device according to claim 1, wherein the distance is larger than 5 μm.

10. The light-emitting device according to claim 1, wherein in the top view of the light-emitting device, the semiconductor stack adjacent to the first edge includes a plurality of convex parts.

11. A light-emitting device, including:
a substrate including a top surface, a first side surface and a second side surface, wherein the first side surface and the second side surface of the substrate are respectively connected to two opposite sides of the top surface of the substrate;
a first light-emitting element and a second light-emitting element formed on the substrate, wherein each of the first light-emitting element and the second light-emitting element comprises a semiconductor stack formed on the top surface of the substrate, the semiconductor stack including a first semiconductor layer, a second semiconductor layer, and an active layer formed between the first semiconductor layer and the second semiconductor layer;
a first electrode pad formed adjacent to a first edge of the light-emitting device; and
a second electrode pad formed adjacent to a second edge of the light-emitting device, wherein in a top view of the light-emitting device, the first edge and the second edge are formed on different sides or opposite sides of the light-emitting device, the first semiconductor layer of the first light-emitting element adjacent to the first edge includes a first sidewall directly connected to the first side surface of the substrate, and the first semiconductor layer of the second light-emitting element adjacent to the second edge includes a second sidewall separated from the second side surface of the substrate by a distance, and wherein the second sidewall of the first semiconductor layer of the second light-emitting element directly contacts the top surface of the substrate.

12. The light-emitting device according to claim 11, wherein a first angle is between the first sidewall of the first semiconductor layer and the top surface of the substrate, a second angle is between the second sidewall of the first semiconductor layer and the top surface of the substrate, and the second angle is different from the first angle.

13. The light-emitting device according to claim 12, wherein the first angle is larger than the second angle.

14. The light-emitting device according to claim 13, wherein the first angle is between 70 degrees and 90 degrees.

15. The light-emitting device according to claim 13, wherein the second angle is between 20 degrees and 70 degrees.

16. The light-emitting device according to claim 11, further including an insulating layer formed on the semiconductor stack, wherein the first sidewall of the first semiconductor layer is not covered by the insulating layer, and the second sidewall of the first semiconductor layer is covered by the insulating layer.

17. The light-emitting device according to claim 16, wherein the insulating layer includes a first side surface of the insulating layer directly connected to the first sidewall of the first semiconductor layer, and a second side surface of the insulating layer formed between the second side surface of the substrate and the second sidewall of the first semiconductor layer and spaced apart from the second side surface of the substrate to expose the top surface of the substrate.

18. The light-emitting device according to claim 16, wherein a portion of the top surface of the substrate adjacent to the second edge is not covered by the insulating layer.

19. The light-emitting device according to claim 11, wherein the distance is preferably larger than 5 μm.

20. The light-emitting device according to claim 11, wherein in the top view of the light-emitting device, the semiconductor stack of the first light-emitting element or the semiconductor stack of the second light-emitting element includes a plurality of convex parts.

\* \* \* \* \*